(12) United States Patent
Mehr

(10) Patent No.: US 10,013,801 B2
(45) Date of Patent: Jul. 3, 2018

(54) TEXTURING A 3D MODELED OBJECT

(71) Applicant: Dassault Systemes, Velizy Villacoublay (FR)

(72) Inventor: Eloi Mehr, Velizy Villacoublay (FR)

(73) Assignee: Dassault Systemes, Velizy Villacoublay (FR)

( * ) Notice: Subject to any disclaimer, the term of this patent is extended or adjusted under 35 U.S.C. 154(b) by 0 days.

(21) Appl. No.: 14/949,686

(22) Filed: Nov. 23, 2015

(65) Prior Publication Data

US 2016/0171765 A1    Jun. 16, 2016

(30) Foreign Application Priority Data

Dec. 10, 2014 (EP) ..................................... 14306986

(51) Int. Cl.
    *G06T 17/20*      (2006.01)
    *G06T 15/04*      (2011.01)
    (Continued)

(52) U.S. Cl.
CPC ............... *G06T 17/20* (2013.01); *G06F 17/11* (2013.01); *G06F 17/18* (2013.01); *G06F 17/50* (2013.01);
(Continued)

(58) Field of Classification Search
None
See application file for complete search history.

(56) References Cited

U.S. PATENT DOCUMENTS

| | | | |
|---|---|---|---|
| 6,549,201 B1 | 4/2003 | Igarashi et al. | |
| 6,654,027 B1 | 11/2003 | Hernandez | |

(Continued)

FOREIGN PATENT DOCUMENTS

| | | |
|---|---|---|
| CN | 104 794 722 | 7/2015 |
| EP | 0 822 522 | 2/1998 |

(Continued)

OTHER PUBLICATIONS

Technion, Michael K., "On Edge Detection on Surfaces", IEEE, 2009.

(Continued)

*Primary Examiner* — Said Broome
(74) *Attorney, Agent, or Firm* — Hamilton, Brook, Smith & Reynolds, P.C.

(57) ABSTRACT

A computer-implemented method for designing a 3D modeled object representing a real object comprises providing a 3D mesh representing the real object, a texturing image and a mapping between the vertices of the 3D mesh and pixels of the texturing image; then maximizing a probability P(L(V)) of the form:

$$P(L(V)) = \frac{1}{Z}\exp\left(-\sum_{i=1}^{n}\varphi'_i(L(v_i)) - \sum_{f \in \mathcal{F}}\psi'_f(\{L(v_i)\}_{i \in f})\right).$$

Maximizing is performed with a predetermined discrete Markov Random Field optimization scheme viewing the 3D mesh and the pixel shifts associated to the texture coordinates of the vertices of the 3D mesh as a Markov Random Field of energy $-\log(P(L(V)))-\log(Z)$. The method then comprises texturing the 3D mesh according to the texturing image, to the mapping, and to the result of the maximizing.

This provides an improved solution for designing a 3D modeled object a real object.

11 Claims, 9 Drawing Sheets

(51) Int. Cl.
| | |
|---|---|
| *G06F 17/18* | (2006.01) |
| *G06F 17/50* | (2006.01) |
| *G06T 15/10* | (2011.01) |
| *G06F 17/11* | (2006.01) |
| *G06T 7/50* | (2017.01) |

(52) U.S. Cl.
CPC .............. *G06T 7/50* (2017.01); *G06T 15/04* (2013.01); *G06T 15/10* (2013.01); *G06T 2207/10028* (2013.01); *G06T 2207/20076* (2013.01)

(56) References Cited

U.S. PATENT DOCUMENTS

| | | | |
|---|---|---|---|
| 8,570,343 | B2 | 10/2013 | Halstead |
| 2002/0028418 | A1 | 3/2002 | Farag |
| 2002/0172413 | A1 | 11/2002 | Chen |
| 2003/0206165 | A1* | 11/2003 | Hoppe .................... G06T 17/20 345/420 |
| 2005/0033142 | A1* | 2/2005 | Madden ............... A61B 5/0059 600/407 |
| 2009/0202160 | A1* | 8/2009 | Kim ........................ G06T 17/20 382/233 |
| 2009/0284550 | A1 | 11/2009 | Shimada et al. |
| 2011/0295564 | A1 | 12/2011 | Chazel |
| 2013/0321403 | A1 | 12/2013 | Piemonte |
| 2014/0064581 | A1 | 3/2014 | Madbhushi |
| 2014/0267279 | A1 | 9/2014 | Kontkanen |
| 2014/0340489 | A1 | 11/2014 | Medioni |
| 2014/0358496 | A1 | 12/2014 | Rameau et al. |
| 2014/0362091 | A1 | 12/2014 | Bouaziz et al. |
| 2015/0142394 | A1 | 5/2015 | Mehr et al. |
| 2015/0213646 | A1 | 7/2015 | Ma et al. |
| 2015/0279118 | A1 | 10/2015 | Dou et al. |
| 2015/0347846 | A1 | 12/2015 | Guzman-Rivera et al. |
| 2016/0127715 | A1 | 5/2016 | Shotton et al. |
| 2017/0193699 | A1 | 7/2017 | Mehr et al. |

FOREIGN PATENT DOCUMENTS

| | | |
|---|---|---|
| WO | WO 2012/048304 | 4/2012 |
| WO | WO 2013/189058 | 12/2013 |
| WO | WO 2016/050290 | 4/2016 |

OTHER PUBLICATIONS

Alj, Y. et al., "Multi-Texturing 3D Models: How to Choose the Best Texture?." IC3D Belgium (2012), hal-00785836, Version 1, 8 pages (Feb. 7, 2013).
Alléne, C., et al., "Seamless Image-Based Texture Atlases using Multi-band Blending," 4 pages.
Azariadis, P.N. et al., "Drawing curves onto a cloud of points for point-based modelling," Computer-Aided Design, 37(1): 109-122 (Jan. 1, 2005).
Baumberg, A. "Blending images for texturing 3D models." BMVC 2002, 404-413 (2002).
Bernardini, F. et al., "High-Quality Texture Reconstruction from Multiple Scans," 14 pages.
Callieri, M., et al., "Masked Photo Blending: mapping dense photographic dataset on high-resolution sampled 3D models," (Jan. 8, 2008).
Canny, J. "A Computational Approach to Edge Detection," IEEE Transactions on Pattern Analysis and Machine Intelligence, PAMI-8(6): 679-698 (Nov. 1986).
Carr, N.A. and Hart, J.C., "Meshed Atlases for Real-Time Procedural Solid Texturing," ACM Transactions on Graphics, 21(2): 26 pages (Apr. 2002).
Clark, X.B. et al., "An Investigation into Graph Cut Parameter Optimisation for Image-Fusion Applications", IVCNZ '12, Dunedin, New Zealand, 6 pages (Nov. 26-28, 2012).
Colbum, A., et al., "Image-Based Remodeling," IEEE Transactions on Visualization and Computer Graphics, 13 pages (2012).
Cui, Y. et al., "3D Shape Scanning with A Time-of-Flight Camera," 8 pages (2010).
Debevec, P.E., et al., "Modeling and Rendering Architecture from Photographs: A hybrid geometry- and image-based approach," Presented at Computer Graphics Proceedings, Annual Conference Series, New Orleans, Lousiana, pp. 11-20 (Aug. 4-9, 1996).
Dellepiane, M., et al., "Flow-based local optimization for image-to-geometry projection," IEEE Transactions on Visualization and Computer Graphics, pp. 1-12.
Dutton, R.D., et al., "Efficiently Identifying the Faces of a Solid," Computers and Graphics, 7:(2):143-147 (1983).
Dutagaci, H., et al., "Evaluation of 3D interest detection techniques via human-generated ground truth," Vis Comput 28: 901-917; Jun. 29, 2012.
Eisemann, M. et al., "Floating Textures," Eurographics, 27(2): 10 pages (2008).
European Search Report and Written Opinion for European Application No. EP13305751, completed Oct. 28, 2013.
European Search Report for European Application No. EP133056576 entitled "Computing Camera Parameters," completed Mar. 26, 2014.
Fabbri, R. et al., "3D Curve Sketch: Flexible Curve-Based Stereo Reconstruction and Calibration," 2010 IEEE Conference on Computer Vision and Pattern Recognition (CVPR), Jun. 13-18, 2010, San Francisco, CA, USA, pp. 1538-1545.
Goldlücke, B. and Cremers, D., "A Superresolution Framework for High-Accuracy Multiview Reconstruction," 10 pages.
Hale, J.G. "Texture re-mapping for decimated polygonal meshes," University of Edinburgh, pp. 1-12.
Hanrahan, P., "Creating Volume Models from Edge-Vertex Graphs," Proceedings of the 9th Annual Conference on Computer Graphics and Interactive Techniques, Siggraph '82, vol. 16, 1982, pp. 77-84.
Hanusch, T., "A New Texture Mapping Algorithm for Photorealistic Reconstruction of 3D Objects," The International Archives of the Photogrammetry, Remote Sensing and Spatial Information Sciences, Beijing, vol. XXXVII(Part B5): 699-706 (2008).
Inoue, K., et al., "Solid Model Reconstruction of Wireframe CAD Models Based on Topological Embeddings of Planar Graphs." 2003.
Ishikawa, H., "Higher-Order Clique Reduction in Binary Graph Cut," IEEE, pp. 2993-3000 (2009).
Jian-dong, Z. et al., "3D curve structure reconstruction from a sparse set of unordered images," Computers in Industry, 60(2): 126-134 (Feb. 1, 2009).
Kappes, J.H. et al., "A Comparative Study of Modern Inference Techniques for Discrete Energy Minimization Problems," 8 pages.
Kuo, M.H., "Automatic extraction of quadric surfaces from wireframe models," Computers & Graphics, 25:1, Feb. 2001 (Feb. 2001).
Kurazume, R., et al., "Simultaneous 2D images and 3D geometric model registration for texture mapping utilizing reflectance attribute," Presented at The 5th Asian Conference on Computer Vision, Melbourne, Australia, pp. 1-8 (Jan. 23-25, 2002).
Laure, F. et al., "Automatic Texturing without Illumination Artifacts from In-hand Scanning Data Flow," Artifacts Free Automatic Texturing for In-Hand Scanning, pp. 1-13.
Lavoue, G., et al., "Markov Random Fields for Improving 3D Mesh Analysis and Segmentation." Eurographics Workshop on 3D Object Retrieval (2008).
Lee, Chang H., et al., "Mesh Saliency," Dept. of Computer Science, University of MD.
Lee, J., et al., "Interactive Retexturing from Unordered Images," 2014 11th International Conference on Ubiquitous Robots and Ambient Intelligence, pp. 18-21 (Nov. 12, 2014).
Lempitsky, V. and Ivanov, D., "Seamless Mosaicing of Image-Based Texture Maps," 6 pages.
Lensch, H.P.A. et al., "Automated Texture Registration and Stitching for Real World Models," 13 pages.
Lévy, B. et al., "Least Squares Conformal Maps for Automatic Texture Atlas Generation," 10 pages.

(56) References Cited

OTHER PUBLICATIONS

Lourakis, M.I.A. and Argyros, A.A., "SBA: A Software Package for Generic Sparse Bundle Adjustment," ACM Transactions on Mathematical Software, 36(1): pp. 2:1-2:30 (Mar. 2009).
Moslah, O. et al., "Geo-Referencing Uncalibrated Photographs using Aerial Images and 3D Urban Models," 6 pages (Jan. 1, 2009).
Moslah, O. et al., "Urban Models Texturing from Un-Calibrated Photographs," IVCNZ, 23rd International Conference, IEEE, Piscataway, NJ pp. 1-6 (Nov. 26, 2008).
Newcombe, R.A., et al., "KinectFusion: Real-Time Dense Surface Mapping and Tracking," 10 pages.
Reisner-Kollmann, I. et al., "Interactive reconstruction of industrial sites using parametric models," Proceedings of the 26th Spring Conference on Computer Graphics, SCCG '10, Jan. 1, 2010, p. 101.
Rocchini, C., et al., "Multiple Textures Stitching and Blending on 3D Objects," Istituto di Elaborazione dell'Informazione, 13 pages.
Štencel, M. and Janáček, J., "On Calculation of Chamfer Distance and Lipschitz Covers in Digital Images," 6 pages.
Surazhsky, T. et al., "A Comparison of Gaussian and Mean Curvatures Estimation Methods on Triangular Meshes," 6 pages.
Van Den Hengel, A. et al., "Video Trace: Rapid interactive scene modelling from video," ACM Transactions on Graphics, 26(3): 86-1-86-5 (Jul. 29, 2007).
Varady, T. et al, "Reverse Engineering of Geometric Models—An Introduction," Computer-Aided Design, 29(4): 255-268 (Apr. 1, 1997).
Wang, L. et al., "Optimal Texture Map Reconstruction from Multiple Views," 8 pages.
Wu, H. et al., "Photogrammetric reconstruction of free-form objects with curvilinear structures," Visual Comput, 21(2): 203-216 (May 1, 2005).
Xu, L., et al., "A General Texture Mapping Framework for Image-based 3D Modeling," 2010 Proceedings of 17th IEEE International Conference on Image Processing, 2010, pp. 2713-2716.
Zhang, E. et al., "Feature-Based Surface Parameterization and Texture Mapping," ACM Transactions on Graphics, 24(1):1-27 (Jan. 2005).
Zhang, Z., "A Flexible New Technique for Camera Calibration," Microsoft Corporation, Technical Report MSR-TR-98-71, 22 pages (Dec. 2, 1998).
Zhou, K. et al., "TextureMontage: Seamless Texturing of Arbitrary Surfaces From Multiple Images," 8 pages.
Chen, T., et al, "3-Sweep: Extracting Editable Objects from a Single Photo," SIGGRAPH ASIA, 2013.
Autodesk 123D Catch; "123D Catch is a free app that lets you create 3D scans of virtually any object" www.123dapp.com/catch ; retrieved from Internet Jan. 14, 2016.
Wu, C., "VisualSFM: A Visual Structure from Motion System" http://homes.cs.washington.edu/~ccwu/vsfm/ ; retrieved from Internet Jan. 14, 2016.
Acute3D Capturing Reality; "Capturing reality with automatic 3D photogrammetry software" http://www.acute3d.com; retrieved from Internet Jan. 8, 2016.
Alexandre, L.A., "3D Descriptors for Object and Category Recognition: a Comparative Evaluation," IROS 2012.
Anguelov, D., et al., "SCAPE: Shape Completion and Animation of People," SIGGRAPH 2005.
Barbie, J., and James, D.L., "Real-Time Subspace Integration for St. Venant-Kirchhoff Deformable Models," SIGGRAPH 2005.
Barron, et al., "Shape, Illumination and Reflectance from Shading," EECS, 2013.
Calakli, F., and Taubin, G., "SSD: Smooth Signed Distance Surface Reconstruction," Pacific Graphics 2011.
Chen, Y., and Cipolla, R., "Single and Sparse View 3D Reconstruction by Learning Shape Priors," CVIU Journal 2011.
Cui, Y., et al., "3D Shape Scanning with a Time-of-Flight Camera," CVPR 2010.
Duncan, K., et al., "Multi-scale Superquadric Fitting for Efficient Shape and Pose Recovery of Unknown Objects," ICRA 2013.
Eitel, A., et al., "Multimodal Deep Learning for Robust RGB-D Object Recognition," International Conference on Intelligent Robots and Systems, 2015.
Eitz, M., et al., "Sketch-Based Shape Retrieval," SIGGRAPH, 2012.
Engel, J., et al., "LSD-SLAM: Large-Scale Direct Monocular SLAM," CVPR2014.
Faugeras, O., "Three-Dimensional Computer Vision: A Geometric viewpoint," MIT Press 1994.
Frefeld, O. and Black, M.J., "Lie Bodies: A Manifold Representation of 3D Human Shape," ECCV 2012.
Furukawa, Y., et al. "Towards Internet-scale Multi-view Stereo," CVPR 2010.
Hartley, R., and Zisserman, A., "Multiple View Geometry in Computer Vision," Cambridge Univ. Press 2004.
Hildebrandt, K., et al., "Eigenmodes of Surface Energies for Shape Analysis," Advances in Geometric Modeling and Processing 2012.
Newcombe, et al. "KinectFusion: Real-Time Dense Surface Mapping and Tracking," Symposium ISMAR 2011.
Kazhdan, M., et al. "Poisson Surface Reconstruction," Eurographics Symposium on Geometry Processing 2006.
Koutsourakis, P., et al., "Single View Reconstruction Using Shape Grammars for Urban Environments," ICCV 2009.
Li, Y., "Database-Assisted Object Retrieval for Real-Time 3D Reconstruction," EUROGRAPHICS, 2015.
Mairal, J., "Sparse Modeling for Image and Vision Processing, Foundations and Trends in Computer Graphics and Vision," 2014.
Nelder, J., and Mead, R., "A Simplex Method for Function Minimization," Computer Journal 1965.
Newcombe, R., et al., "Live Dense Reconstruction with a Single Moving Camera," IEEE ICCV2011.
Prados, et al., "Shape from Shading ," Handbook of Mathematical Models in Computer Vision, 2006.
"Reconstruct your world with ReconstructMe", reconstructme.net; retrieved from Internet Jan. 14, 2016.
Rother, C., et al., "GrabCut—Interactive Foreground Extraction using Iterated Graph Cuts," SIGGRAPH 2004.
Rusu, R.B., et al., "Fast Point Feature Histograms (FPFH) for 3D Registration," ICRA 2009.
SDK for Kinect, KinectFusion, http://www.microsoft.com retrieved from Internet Jan. 14, 2016.
Sifakis, E.D., "FEM Simulation of 3D Deformable Solids: A Practitioner's Guide to Theory, Discretization and Model Reduction," SIGGRAPH 2012 Course.
Szeliski, R., "Computer Vision: Algorithms and Applications," Edition Springer 2010.
Oswald, M., et al., "Fast and Globally Optimal Single View Reconstruction of Curved Objects," CVPR, 2012.
Tombari, T., et al., "Unique Signatures of Histograms for local Surface Description," ECCV 2010.
Wohlhart, P., and Lepetit, V., "Learning Descriptors for Object Recognition and 3D Pose Estimation," Computer Vision and Pattern Recognition, 2015.
Zheng, et al., "Interactive Images: Cuboid Proxies for Smart Image Segmentation," SIGGRAPH, 2012.
Krizhevsky, Alex, Ilya Sutskever, and Geoffrey E. Hinton. "ImageNet Classification with Deep Convolutional Neural Networks." *Advances in Neural Information Processing Systems*. 2012.
Loper, Matthew M., and Michael J. Black. "OpenDR: An Approximate Differentiable Renderer." *European Conference on Computer Vision*. Springer International Publishing, 2014.
Chen, Yinpeng, Zicheng Liu, and Zhengyou Zhang. "Tensor-Based Human Body Modeling." *Proceedings of the IEEE Conference on Computer Vision and Pattern Recognition*. 2013.
Bălan, Alexandru O., and Michael J. Black. "The Naked Truth: Estimating Body Shape Under Clothing." *European Conference on Computer Vision*. Springer Berlin Heidelberg, 2008.
Bălan, Alexandru O., et al., "Detailed Human Shape and Pose From Images." 2007 *IEEE Conference on Computer Vision and Pattern Recognition*. IEEE, 2007.
Guan, Peng, et al. "Estimating Human Shape and Pose From a Single Image." *2009 IEEE 12th International Conference on Computer Vision*. IEEE, 2009.

(56) References Cited

OTHER PUBLICATIONS

Weiss, Alexander, David Hirshberg, and Michael J. Black. "Home 3D Body Scans From Noisy Image and Range Data." 2011 *International Conference on Computer Vision*. IEEE, 2011.
Perbet, Frank, et al. "Human Body Shape Estimation Using a Multi-Resolution Manifold Forest." *Proceedings of the IEEE Conference on Computer Vision and Pattern Recognition*. 2014.
Gschwandtner, M., et al., "BlenSor: Blender Sensor Simulation Toolbox", Advances in Visual Computing: 7th International Symposium, vol. 6939/2011 pp. 199-208, 2011.
Nguyen, C., et al., "Modeling Kinect Sensor Noise for Improved 3D Reconstruction and Tracking", 2012 Second Joint 3DIM/3DPVT Conference: 3D Imaging, Modeling, Processing, Visualization & Transmission, IEEE, 2012.
Chatterjee, A., et al., "Noise in Structured-Light Stereo Depth Cameras: Modeling and its Applications", Dept. of Engineering, Indian Institute of Science, Bengaluru, May 8, 2015.
Belhedi, A., et al., "Noise Modelling and Uncertainty Propagation for TOF Sensors", International Conference of Computer Vision, 2012.
Zeng, M., et al. "Dynamic Human Surface Reconstruction Using a Single Kinect", 13th International Conference on Computer-Aided Design and Computer Graphics, 2013.
Leizea, I., et al. "Real-time Deformation, Registration and Tracking of Solids Based on Physical Simulation", IEEE International Symposium on Mixed and Augmented Reality, Science and Technology Proceedings, Sep. 10-12, 2014.
Zollhöfer, M., et al. "Real-time Non-rigid Reconstruction using an RGB-D Camera", ACM Transactions on Graphics, vol. 22, No. 4, Article 156, Jul. 2014.
Leizea, I., et al., "Development and Improvement of Optical Tracking Methods towards Registering the Deformations of 3D Non-Rigid Bodies in Real Time for Augmented Reality Applications", Ph.D. Thesis, pp. 1-314, Feb. 2015.
EP Search Report for EP 15 30 7199 dated Jun. 17, 2016 entitled "Reconstructing a 3D Modeled Object".

Komodakis, N., et al.,. "Image Completion Using Efficient Belief Propagation Via Priority Scheduling and Dynamic Pruning," IEEE Transactions on Image Processing 2007.
Komodakis, N., et al., "MRF Optimization via Dual Decomposition: Message Passing Revisited," IEEE Trans. 2011.
Komodakis, N., "Image Completion Using Global Optimization," CVPR 2006.
Kolmogorov, V. . "Convergent Tree-Reweighted Message Passing for Energy Minimization," Pattern Analysis and Machine Intelligence, IEEE 2006.
Zheng Jian-dong et al., "3D Curve Structure Reconstruction From a Sparse Set of Unordered Images," Computers in Industry 60 (2009).
European Search Report for EP 16 18 8268 dated Feb. 21, 2017.
Handa, A., et al., "A Benchmark for RGB-D Visual Odometry, 3D Reconstruction and SLAM", 2014 IEEE International Conference on Robotics and Automation (ICRA), IEEE, pp. 1524-1531, May 31, 2014.
Handa, A., et al., "Understanding Real World Indoor Scenes with Synthetic Data", 2016 IEEE Conference on Computer Vision and Pattern Recognition (CVPR), IEEE, pp. 4077-4085, Jun. 27, 2016.
Xu, K., et al., "Data-Driven Shape Analysis and Processing" Computer Graphics Forum, pp. 1-27, Feb. 24, 2015.
Shotton, J., et al., "Real-Time Human Pose Recognition in Parts from Single Depth Images", Communications of the ACM, vol. 56, No. 1, Jan. 2013.
Salamati, N., et al. "Incorporating Near-Infrared Information into Semantic Image Segmentation", CORR, Jun. 24, 2014.
Krahenbuhl, P., et al. "Efficient Inference in Fully Connected CRFs with Gaussian Edge Potentials" Computer Science Department, Stanford University, May 12, 2017.
Hoegner, L., et al. "Towards People Detection from Fused Time-of-Flight and Thermal Infrared Images" International Archives of the Photogrammetry, Remote Sensing and Spatial Information Sciences, vol. X1-3, Aug. 11, 2014.
European Search Report for EP 16 30 6860 dated May 19, 2017.

\* cited by examiner

TEXTURING A 3D MODELED OBJECT

RELATED APPLICATION

This application claims priority under 35 U.S.C. § 119 or 365 to European Application No. 14306986.2, filed Dec. 10, 2014. The entire teachings of the above application(s) are incorporated herein by reference.

FIELD OF THE INVENTION

The invention relates to the field of computer programs and systems, and more specifically to a method, system and program for designing a 3D modeled object representing a real object.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In this context, the field of computer vision and computer graphics offers technologies which are more and more useful. Indeed, this field has applications to 3D reconstruction, 3D models texturing, virtual reality and all domains where it is necessary to precisely build a 3D scene with exact geometry using as input, for example, the information in a set of photographs. 3D texturing can be used in any field which involves the creation of textured 3D models, such as serious gaming, video games, architecture, archeology, reverse engineering, 3D assets database, or virtual environments. 3D reconstruction from video stream and photographs set analysis is addressed in two different approaches in the state of the art, depending on the type of sensors used for the input data.

The first approach uses "receiver" sensors. This notably concerns 3D reconstruction from RGB images analysis. Here, 3D reconstruction is obtained by multi-view analysis of RGB color information contained in each of the image planes. The following papers relate to this approach:

R. Hartley and A. Zisserman: *Multiple View Geometry in Computer Vision*, Cambridge Univ. Press 2004;

R. Szeliski: Computer Vision: *Algorithms and Applications*, Edition Springer 2010; and O. Faugeras: *Three-Dimensional Computer Vision: A Geometric viewpoint*, MIT Press 1994.

The second approach uses "emitter-receiver" sensors. This notably concerns 3D reconstruction from RGB-Depth images analysis. This kind of sensors gives additional depth data to standard RGB data, and it is depth information that is mainly used in the reconstruction process. The following papers relate to this approach:

Yan Cui et al.: 3D Shape Scanning with a Time-of-Flight Camera, CVPR 2010;

R S. Izadi et al.: *KinectFusion: Real-Time Dense Surface Mapping and Tracking*, Symposium ISMAR 2011; and R. Newcombe et al.: *Live Dense Reconstruction with a Single Moving Camera*, IEEE ICCV2011.

Moreover, several academic and industrial players now offer software solutions for 3D reconstruction, by RGB image analysis, such as Acute3D, Autodesk, VisualSFM, or by RGB-Depth analysis, such as ReconstructMe or Microsoft's SDK for Kinect (registered trademarks).

Multi-view photogrammetry reconstruction methods use the sole information contained in the image plans of a video sequence (or a series of snapshots) in order to estimate 3D geometry of the scene. The matching of interest points between different ones of the 2D views yields the relative positions of the camera. An optimized triangulation is then used to compute the 3D points corresponding to the matching pair. Depth-map analysis reconstruction methods are based on disparity maps or approximated 3D point clouds. Those disparity maps are obtained using stereovision or structured light (see the 'Kinect' device for example) or 'Time of Flight' 3D-cameras. These state-of-the-art reconstruction methods then typically output a discrete 3D representation of the real object, most often a 3D mesh. The 3D model derives from the in fine volume closing off the resulting 3D point cloud.

A further step known from the prior art is to produce a texture for each polygon on the 3D mesh. In order to ensure photo-realism, prior art requires that the rendering use standard images from high-quality devices capturing the scene simultaneously. This is explained in the paper by T. Hanusch, "*A new texture mapping algorithm for photorealistic reconstruction of* 3D *objects*", in ISPRS journal of photogrammetry and remote sensing.

FIG. 1 illustrates a common approach used to texture a 3D model with a photograph, which is the well-known projective texture mapping method. This method is described for example in the paper by P. Debevec, C. Taylor and J. Malik, "*Modeling and Rendering Architecture from Photographs: A hybrid geometry-and image-based approach*", in SIGGRAPH 1996. This method uses image projection data associated to a 2D view (relative to the 3D model) to compute the mapping to the 3D model. FIG. 1 shows such a view-dependent 3D model texturing principle for 3D meshed model 102 and calibrated image 104: a projection texture mapping (represented by bundle 106, computed from camera projection matrix and departing from optical center 108) is used to estimate the texture coordinate for each triangle vertex.

Now, as illustrated on FIG. 2, the texturing quality by projection onto the 3D model is highly dependent on camera pose estimation. Indeed, FIG. 2 illustrates the 3D model texturing problematic: on the left, accurate calibration data allows coherent texturing 104 by projection on 3D model 102, whereas, on the right, inaccurate calibration data induces a drift in the projection of texturing 104 relative to 3D model 102. In other words, the estimation of camera rotation and translation at the time of the snapshot has a high impact on the final texturing. Obviously, any bias on the camera pose translates onto the re-projection and deteriorates the texturing process. Such a bias is usually particularly significant in the case of depth-map analysis methods. It generally originates from a shift in synchronizing between the depth sensor and the RGB sensor, corrupting the camera trajectory estimation. But it may also originate from: an outside shot from an independent camera whose relative position to the 3D model cannot be estimated with sufficient accuracy because there is no rigid dependency to the depth sensor; a noisy sensor, leading to inaccurate 3D models and camera poses; a drift in the 3D reconstruction process, leading to inaccurate 3D models; and/or distorted images leading to inaccurate texture mapping onto the 3D model.

Within this context, there is still a need for an improved solution for designing a 3D modeled object representing a real object.

SUMMARY OF THE INVENTION

It is therefore provided a computer-implemented method for designing a 3D modeled object representing a real object. The method comprises the steps of providing a 3D mesh representing the real object and having vertices, a texturing image and a mapping between the vertices of the 3D mesh and pixels of the texturing image; then maximizing a probability $P(L(V))$ of the form:

$$P(L(V)) = \frac{1}{z}\exp\left(-\sum_{i=1}^{n}\varphi_i'(L(v_i)) - \sum_{f \in \mathcal{F}}\psi_f'(\{L(v_i)\}_{i \in f})\right).$$

n designates the number of vertices of the 3D mesh and $v_i$ designates the vertices of the 3D mesh. $L(v_i)$ designates a pixel shift to be applied after mapping vertex $v_i$ on the texturing image and selected in a predetermined finite set (L).

$$Z = \Sigma_{L(V)} \exp(-\Sigma_{i=1}^{n}\varphi_i'(L(v_i)) - \Sigma_{f \in F}\psi_f'(\{L(v_i)\}_{i \in f})).$$

F designates the set of sets of indices of mesh tiles of the 3D mesh. $\varphi_i'$ designates a cost function associated to vertex $v_i$ and decreasingly depending on an extent to which the result of applying the pixel shift, selected for vertex $v_i$, after mapping vertex $v_i$ on the texturing image respects a predetermined relation between vertices of the 3D mesh and pixels of the texturing image. $\psi_f'$ designates a cost function associated to a tile f of the 3D mesh and depending on a global difference between pixel shifts selected for the vertices of tile f. The step of maximizing is performed with a predetermined discrete Markov Random Field optimization scheme. The scheme views the 3D mesh and the pixel shifts associated to the texture coordinates of the vertices of the 3D mesh as a Markov Random Field of energy:

$$-\log(P(L(V))) - \log(Z) = \Sigma_{i=1}^{n}\varphi_i'(L(v_i)) + \Sigma_{f \in F}\psi_f'(\{L(v_i)\}_{i \in f}).$$

The method also comprises texturing the 3D mesh according to the texturing image, to the mapping, and to the result of the step of maximizing The method may comprise one or more of the following:
the cost function $\psi_f'$ is of the form $$\psi_f'(\{L(v_i)\}_{i \in f}) = \Sigma_{\{i,j\} \in p(f)} \psi_{i,j}'(L(v_i), L(v_j)),$$

where p(f) designates the set of pairs of indices of vertices of tile f, and the predetermined discrete Markov Random Field optimization scheme is a pairwise discrete Markov Random Field optimization scheme;

$\psi_{i,j}'(L(v_i), L(v_j))$ is of the form $$\frac{\lambda}{3}(\|L(v_i) - L(v_j)\|_1,$$

where $\lambda$ designates a positive scalar;
the predetermined relation between vertices of the 3D mesh and pixels of the texturing image amounts to a predetermined relation between 3D curvature values for a vertex of the 3D mesh and distance values to a nearest contour of the texturing image for a pixel of the texturing image;

3D curvature values lower than a predetermined threshold are in the predetermined relation with all distance values, and 3D curvature values higher than the predetermined threshold are in the predetermined relation with distance values according to an increasing one-to-one correspondence;

$\varphi_i'$ is of the form $$\varphi_i'(L(v_i)) = 1_{C_i > c}\left|\frac{\gamma}{C_i} - T_i(L(v_i))\right|,$$

where $1_{C_i > c}$ designates an indicator function, with $C_i$ designating the maximal 3D curvature of vertex $v_i$ and c designating a positive scalar, $\gamma$ designates a positive scalar, $T_i(L(v_i))$ designates the value of a distance transform of the texturing image at the result of applying the pixel shift, selected for vertex $v_i$, after mapping vertex $v_i$ on the texturing image, the distance transform being relative to a contour image of the texturing image;

the contour image is determined with a Canny edge detector applied on the texturing image;

the distance transform of the texturing image is determined with a Chamfer mask applied on the texturing image relative to the contour image of the texturing image; and/or the 3D mesh, the texturing image and the mapping are all outputted by a predetermined structure-from-motion analysis scheme applied on the real object, the mapping corresponding to pose camera parameters determined for the texturing image in the structure-from-motion analysis.

It is further provided a computer program comprising instructions for performing the method.

It is further provided a computer readable storage medium having recorded thereon, or in a container, the computer program.

It is further provided a computer system comprising a processor coupled to a memory and a graphical user interface, the memory having recorded thereon the computer program.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Embodiments of the invention will now be described, by way of non-limiting example, and in reference to the accompanying drawings, where.

DETAILED DESCRIPTION OF THE INVENTION

Figure 3:
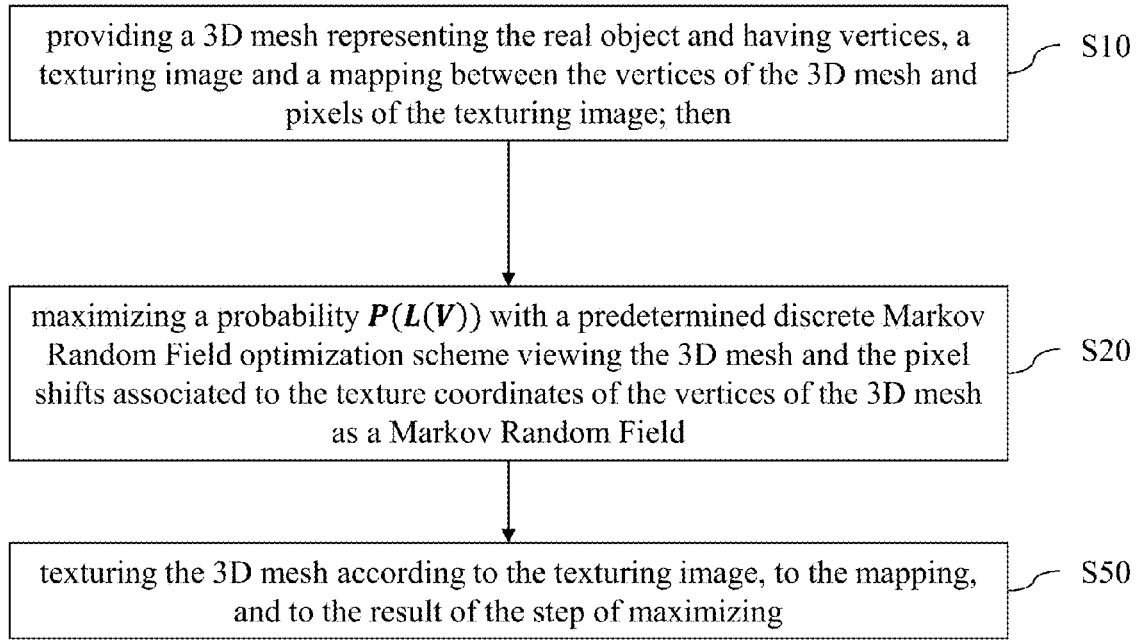
FIG. 3 shows a flowchart of an example of the method.

With reference to the flowchart of FIG. 3, it is proposed a computer-implemented method for designing a 3D modeled object representing a real object. Throughout the method, the 3D modeled object designates data that represent the real object in different ways: first its geometry via a 3D mesh, and then a textured geometry via the textured 3D mesh outputted by the method. The method comprises a step of providing S10 a 3D mesh representing the real object (the 3D mesh having notably vertices defined by 3D positions, e.g. but also edges linking the vertices, such as a triangular or a quad mesh), e.g. a 3D mesh without any texturing or with a texturing to be replaced by a new one (i.e. the texturing outputted by the method), a texturing image (a 2D view, e.g. an image such as a photograph, of the real object provided with values at pixel locations, of gray-level or of colors such as RGB values, being noted that the figures later illustrating examples of the method mainly show gray-level texturing images but that all these examples of the method may obviously apply mutatis mutandis to a color texturing image as well, e.g. an RGB image) and a mapping between the vertices of the 3D mesh and pixels of the texturing image (i.e. a function that corresponds positions of the 3D mesh to 2D locations, e.g. pixels, of the texturing image, such as camera pose parameters provided with the texturing image). Of course, the 3D mesh may represent only a part of the real object visible on the texturing image. Also, the method may be repeated with several texturing images. Such mesh "partitioning" and "iteration" features are implementation details in 3D mesh texturing known to the skilled person.

The method comprises then a step of maximizing S20 a probability (or likelihood) function P(L(V)). As known per se, from a computer-implementation point of view, this means that the method runs an optimization program that mathematically amounts to (at least substantially, or at least approximately in the case of pseudo-optimization or the use of a heuristic) finding, at least, the argument that maximizes said function. Said "optimal argument" is actually the data of interest here, the result of the evaluation of the probability at said optimal argument not being of particular interest for the present application. Probability P(L(V)) is of the following form:

$$P(L(V)) = \frac{1}{Z}\exp\left(-\sum_{i=1}^{n}\varphi_i'(L(v_i)) - \sum_{f\in\mathcal{F}}\psi_f'(\{L(v_i)\}_{i\in f})\right).$$

In practice, an energy which comprises a negative logarithmic term of the previous probability may actually be minimized by predetermined optimization schemes at use (but this amounts to the same result).

n designates the number of vertices of the 3D mesh and $v_i$ designates the vertices of the 3D mesh. $L(v_i)$ designates a pixel shift to be applied after mapping vertex $v_i$ on the texturing image, all pixel shifts being selected/defined (i e taking values) in a predetermined finite set or list (L), for example L={(0,0), (0,1), (1,1), (1,0), (1,-1), (0,-1), (-1,-1), (-1,0), (-1,1)} with (x,y) indicating e.g. a shift in x pixels in the horizontal direction (e.g. the right direction applying to positive values) and in y pixels in the vertical direction (e.g. the upper direction applying to positive values). L(V), the argument of the optimization program, thus designates a set of pixel shifts (basically couples of positive and/or negative integers) that are explored by the optimization program, the optimal argument designating the pixel shifts that are actually and eventually applied by the method to the vertices (once such vertices are projected onto the texturing image according to the mapping) before performing the texturing (i.e. the texturing coordinates defined by the sole mapping are thereby "corrected" or "improved" by the method, thanks to this pixel shift outputted by the optimization step S20).

$Z=\sum_{L(V)} \exp(-\sum_{i=1}^{n}\varphi_i'(L(v_i))-\sum_{f\in F}\psi_f'(\{L(v_i)\}_{i\in f}))$ designates a normalization term that ensures that the value of P is such that it is indeed a probability (in practice, Z need not necessarily be evaluated). F designates the set of sets of indices of mesh tiles (i.e. faces) of the 3D mesh.

$\varphi_i'$ designates a cost function associated to vertex $v_i$. Cost function $\varphi_i'$ decreasingly depends on a specific variable (i.e. it is a decreasing function of said variable). Said variable is in specific an extent (examples of how to measure/determine such extent being provided later) to which the result of applying the pixel shift selected for vertex $v_i$ (i.e. the pixel shift relevant to vertex $v_i$ in the exploration of the argument solution during the optimization and noted $L(v_i)$ in the optimization process but which can in fine be noted $L(v_i)^*$ once the program is solved and a single pixel shift is retained, such notation being classical in the field of applied mathematics and optimization), after mapping vertex $v_i$ on the texturing image (according to the mapping provided at S10), respects a predetermined relation between vertices of the 3D mesh and pixels of the texturing image. In other words, the system is provided with a predetermined relation (e.g. a predetermined knowledge that geometrical features of the 3D mesh should correspond to graphical features of the texturing image, e.g. such correspondence being distinct from the mapping provided at S10) between vertices of the 3D mesh and pixels of the texturing image and the maximization program tends to find a pixel shift $L^*$ that makes vertex $v_i$ respect such relation as much as possible. The more an explored pixel shift makes the predetermined relation true, the less it will cost in the optimization such that its value will tend to be eventually retained in the optimum.

$\psi_f'$ designates similarly a cost function, but this time associated to a tile f of the 3D mesh and depending on a global difference between pixel shifts selected for the vertices of tile f. $\psi_f'$ penalizes such high global difference. In other words, the optimization tends in the exploration of the argument solution to reach pixel shifts that are, as much as possible, the same for all vertices of each respective single tile f. Such a term provide a good result from a visual/accuracy point of view as it relies on an assumption of global coherency in the texturing drifts, in the context of the method where a texturing image of a real object reconstructed as a 3D mesh is provided (e.g. a structure-from-motion analysis context).

Written in such a way, the maximization appears to amount to a Markov Random Field (MRF) optimization problem, where the MRF is the value of the pixel shifts assigned to the vertices of the mesh, the edges of the mesh representing conditional probabilities. The method actually includes performing the step of maximizing S20 with a predetermined discrete Markov Random Field optimization scheme (a class of well-known optimization schemes that converge efficiently—i.e., accurately and fast-for MRF problems), viewing the 3D mesh and the pixel shifts associated to the texture coordinates of the vertices of the 3D mesh (i.e. the texture coordinates being the pixels of the texturing image obtained by applying the mapping to the vertices of the 3D mesh) as a Markov Random Field of energy: $-\log(P(L(V)))-\log(Z)=\Sigma_{i=1}^{n}\varphi_i'(L(v_i))+\Sigma_{f\in F}\psi_f'(\{L(v_i)\}_{i\in f}))$. In other terms, the predetermined discrete MRF optimization scheme, which can be any known such scheme, is configured for the above-defined MRF structure with the above-defined energy corresponding to probability P. It is again noted that in practice, $-\log(Z)$ may be left unevaluated.

Once the program optimized and the optimal argument pixel shift $L^*$ obtained, the method comprises a step of texturing S30 the 3D mesh according to the texturing image, to the mapping, and to the result of the step S20 of maximizing (said optimal argument pixel shift $L^*$). In brief, the method inserts within the classical texturing an application of the pixel shift $L^*$ to the texture coordinates implied by the data provided at S10. The method may for example project each respective 3D vertex of the 3D mesh on the texturing image, apply the optimal shift obtained at S20 (for that vertex) to find the (optimal, according to the method) respective texturing pixel, and then assign to said respective 3D vertex the texture/color (or any other data relevant to 3D texturing) found at the respective texturing pixel. This process is classical in the field, the originality of the method lying in the introduction of a pixel shift map obtained by optimization S20.

Such a method allows an improved way of designing a 3D modeled object. Notably, the method allows the texturing of a 3D mesh that represents a real object, and thus an improvement of the representation of the real object, which is an advantage that 3D reconstruction and texturing algorithms generally aim at obtaining. Furthermore, as the method acts without modifying the inputs provided at S10, the method can be used in conjunction with any other optimization algorithm that globally improves 3D mesh texturing (such as those of the prior art, e.g. identified earlier). Indeed, the method introduces a new variable: pixel shift L. The method then optimizes such variable, e.g. leaving other variables untouched. The method may thus form yet another optimization layer in a global process of performing a 3D reconstruction with texturing.

For example, the method may comprise, prior to the maximizing S20, possibly prior to the providing S10: providing the 3D mesh representation of the real object provided at S10; identifying, by fully automatic detection, occurrences of a geometric feature at 3D positions of the 3D representation, the geometric feature occurring and being detected each time a 3D curvature of the 3D representation is above a predetermined threshold; providing at least one 2D view of the real object, wherein the 2D view is an image of the real object that forms the texturing image provided at S10; identifying, by fully automatic detection, occurrences of a graphic feature at 2D positions of the 2D view, the geometric feature corresponding to the graphic feature, the graphic feature relating to a pixel gradient of the 2D view; computing the mapping provided at S10 as camera parameters, including a projection matrix which describes projection from the 3D representation to the 2D view, that minimize a distance between a set of projections of the 3D positions of the geometric feature on the 2D view and a set of the 2D positions of the graphic feature, wherein the distance is a predetermined distance between two general sets of 2D points. Such a scheme, that allows obtaining relatively accurate camera parameters or improving accuracy thereof, may be performed according to application EP13306576.3 of 18 Nov. 2013 in the name of DASSAULT SYSTEMES, which is incorporated herein by reference.

Most importantly, the specific way the pixel shift is optimized (that is, the specific optimization program implemented, with its specific cost terms), allows obtaining a good result from a visual/accuracy point of view, and this with a discrete Markov Random Field optimization scheme, which, as known, converges relatively fast. The method thus smartly makes use of a powerful mathematical tool to obtain computationally fast results in the context of 3D texturing. Notably, any MRF solving scheme described in the following references may be implemented and used:

J. Kappes et al, "*A Comparative Study of Modern Inference Techniques for Discrete Minimization Problems*", in CVPR 2013; or H. Ishikawa, "*Higher-Order Clique Reduction in Binary Graph Cut*", in CVPR 2009.

These are however only examples, as any (e.g. high order) MRF solving scheme in general may be implemented by the method.

The method is computer-implemented. This means that the steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined. For instance, the step of maximizing S20 and/or the step of texturing S30 may fully automatic, but they may alternatively involve some manual user-interaction. The user may indeed directly identify/add occurrences of geometric features and/or graphic features on the 3D mesh and/or the texturing image to complete the above-mentioned predetermined relation involved in the optimization via cost function $\varphi_i'$.

A typical example of computer-implementation of the method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database). The system may also comprise devices to create the 3D mesh and/or to capture the texturing image, such as (e.g. RGB) camera(s) and/or depth sensor(s). The system may indeed be adapted in particular for performing a structure-from-motion analysis.

The method generally manipulates modeled objects. A modeled object is any object defined by data stored in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a real object such as a product such as a part or an assembly of parts, or possibly an assembly of products. By "3D modeled object", it is meant any object which is modeled by data allowing at least its 3D representation (the 3D representation in the case of the method). A 3D representation allows the viewing of the part from all angles. For example, the 3D representation may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g. mechanical) part or assembly of parts, or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore or transportation. The 3D modeled object designed by the method thus represents an industrial product which may be a part of a terrestrial vehicle (including e.g. car and light truck equipment, racing cars, motorcycles, truck and motor equipment, trucks and buses, trains), a part of an air vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

By PLM system, it is meant any system adapted for the management of a modeled object representing a physical manufactured product. In a PLM system, a modeled object is thus defined by data suitable for the manufacturing of a physical object. These may typically be dimension values and/or tolerance values. For a correct manufacturing of an object, it is indeed better to have such values.

CAM stands for Computer-Aided Manufacturing. By CAM solution, it is meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

CAE stands for Computer-Aided Engineering. By CAE solution, it is meant any solution, software of hardware, adapted for the analysis of the physical behavior of modeled object. A well-known and widely used CAE technique is the Finite Element Method (FEM) which typically involves a division of a modeled objet into elements which physical behaviors can be computed and simulated through equations. Such CAE solutions are provided by Dassault Systèmes under the trademark SIMULIA®. Another growing CAE technique involves the modeling and analysis of complex systems composed a plurality components from different fields of physics without CAD geometry data. CAE solutions allows the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

Figure 4:
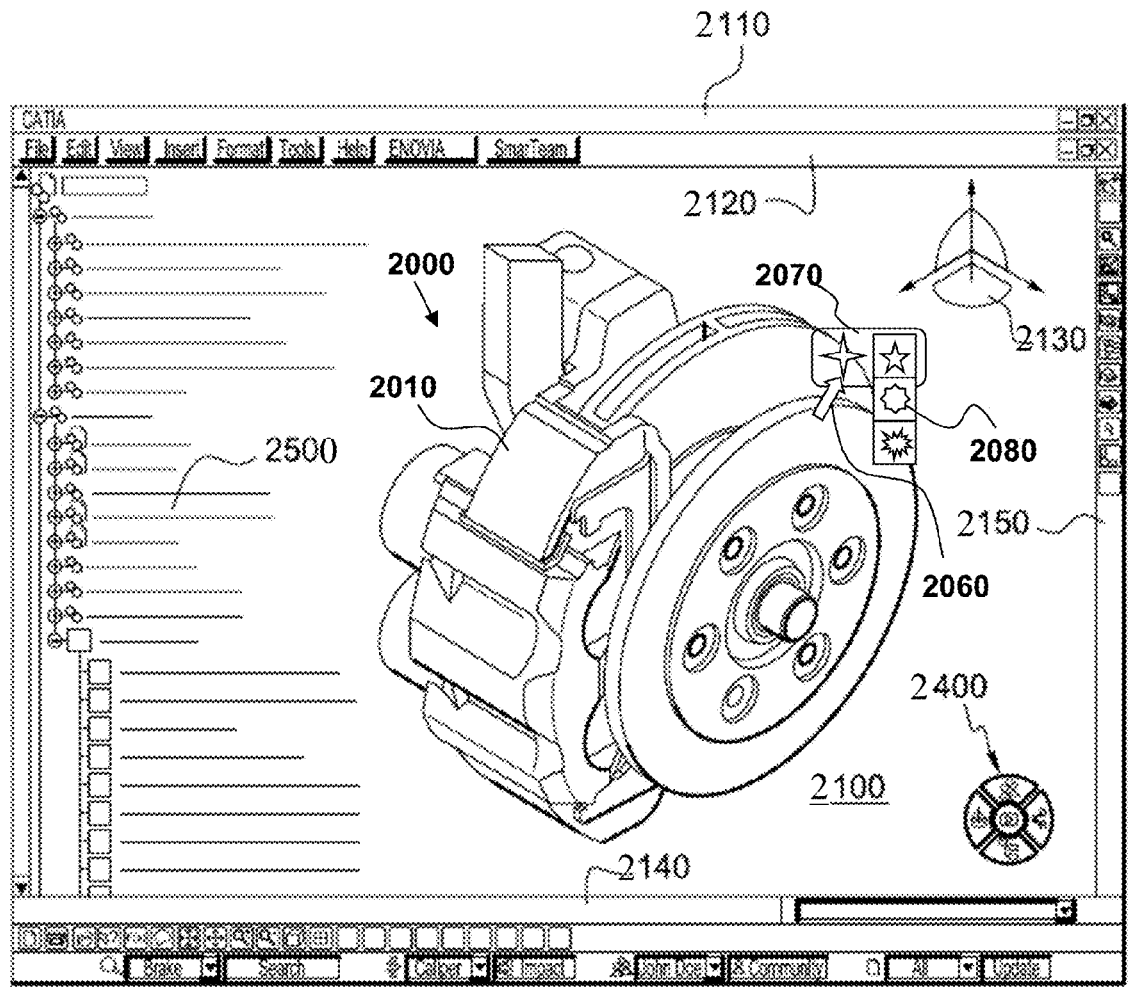
FIG. 4 shows an example of a graphical user interface of the system.

FIG. 4 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

Figure 1:
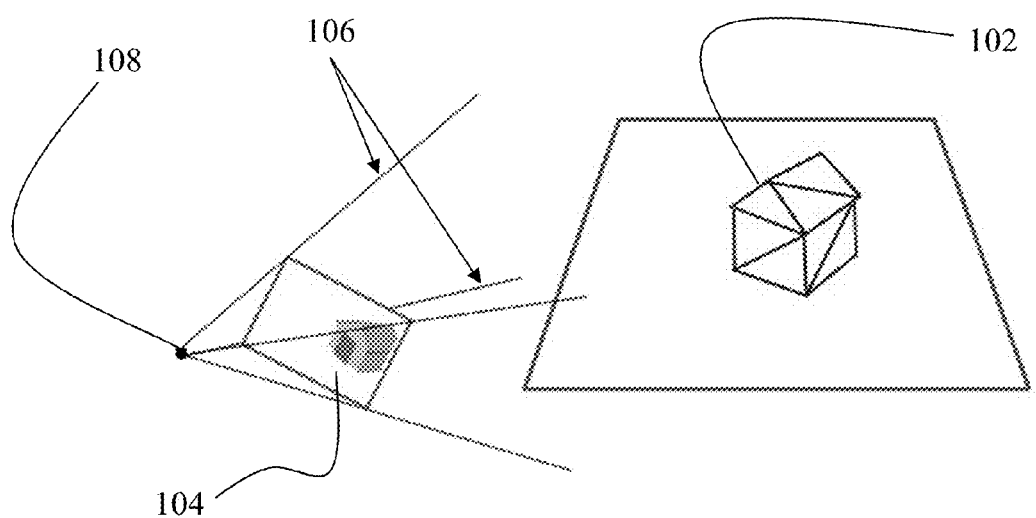
FIGS. 1-2 illustrate the prior art.
Figure 2:
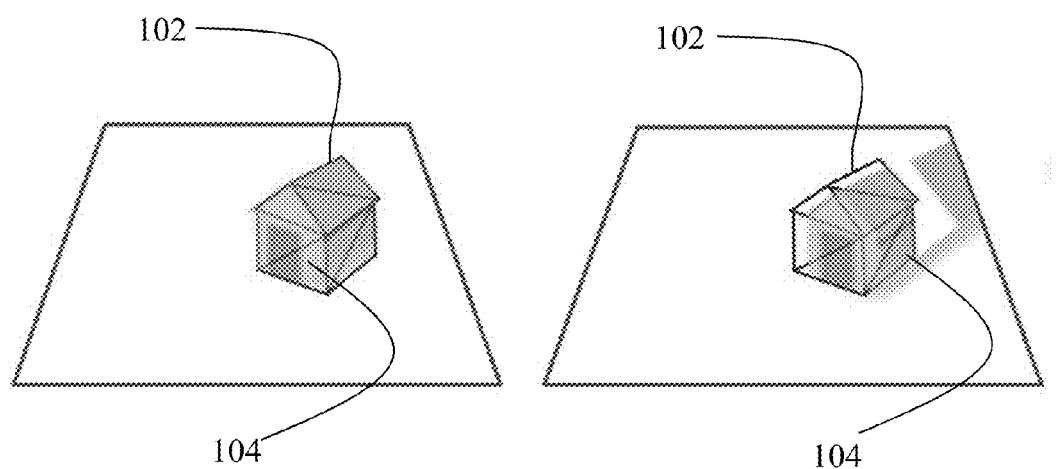

The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 5:
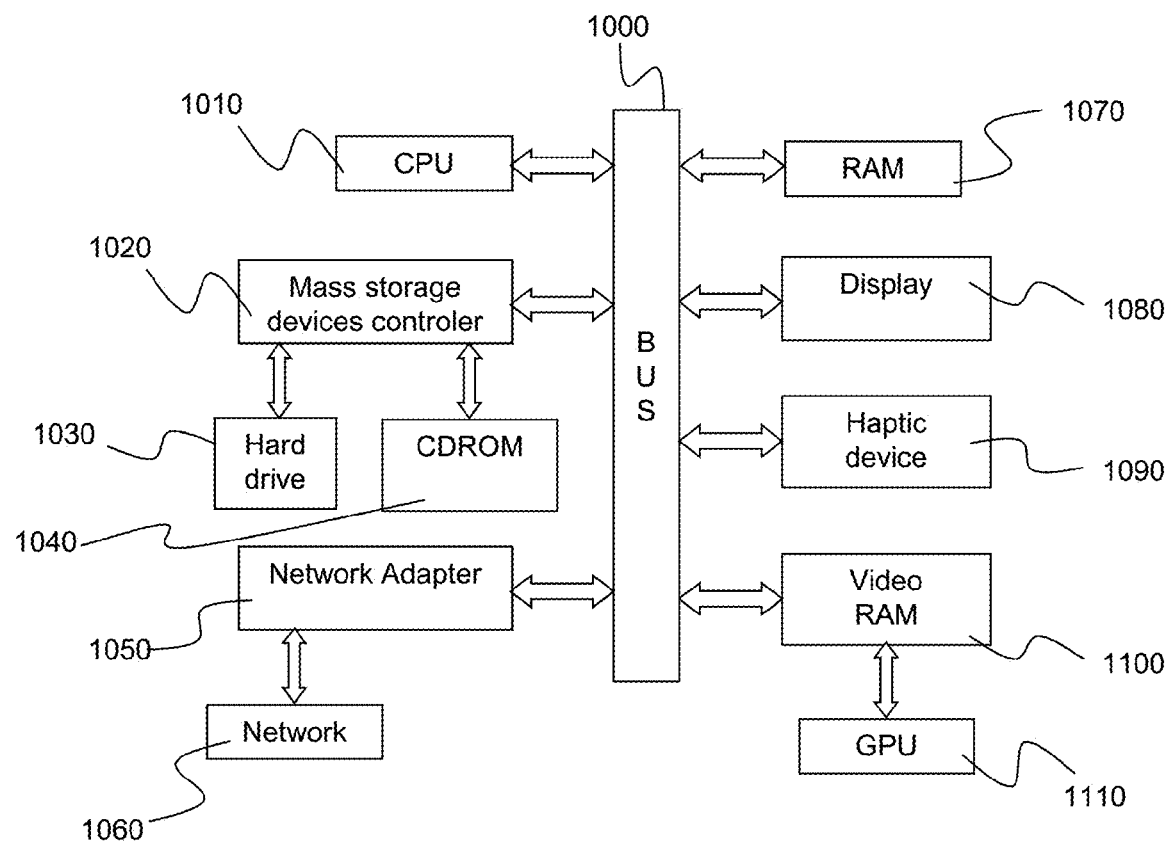
FIG. 5 shows an example of the system.

FIG. 5 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium (for instance, in a container thereon), including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

"Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The method may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

The method allows getting high quality textured 3D meshes, without artifact (relatively), even in the case of an inaccurate 3D mesh as input. The method takes into account that in general the projective texture mapping algorithm cannot perfectly texture an inaccurate 3D model, even with a perfect calibration and pose estimation of the camera. Besides, it is very hard to directly optimize the inaccurate 3D model itself using only a single texture. The algorithm used by the method optimizes the texture coordinates in order to correct the visible artifacts of the texture mapping. Thus, the algorithm of the method handles inaccurate 3D models as well as distortions in the input texture. The optimization is based on a discrete energy formulation, which is more efficient and faster than a continuous one. It also avoids the numerous poor local minima where continuous optimizations fall in due to the very high dimension of parameters' space (typically higher than 10,000 in the context of the later detailed examples).

In examples, every visible vertex of the 3D model is assigned a texture coordinate on the texture, easily computed by projective texture mapping (which is merely a projection of the 3D model onto the image according to the mapping provided at 10). The texture coordinate is a 2D vector, which can usually be called a UV coordinate. Each UV coordinate (of each visible vertex) can then be adjusted with a discrete optimization, so that the image better fits the projected 3D model. In examples, the method sees a (e.g. triangular) 3D mesh as a 3D graph, where each vertex is a node, and each edge connecting two vertices is an edge in the graph. The discrete energy optimization is written as a Markov Random Field inference based on this 3D graph.

Each node can take several labels representing a displacement of the UV coordinate (i.e. pixel shifts). In the discrete energy formulation, each node has its own data term, representing the conditional probability of this node to take a specific label knowing (in examples) its curvature and the edges (high gradient contours) of the input texturing image. Moreover, the Markov Random Field also contains what can be called a "smoothness term", which represents the probability of a node to take a specific label, knowing the labels of its neighbors in the graph. This term enforces neighboring nodes to have close labels. Thus this discrete energy formulation can also be seen as a MAP (Maximum A Posteriori) inference problem within a probabilistic framework, and the method aims at finding the most likely labeling. Briefly, this optimization tends in particularly efficient examples to adjust the UV coordinates of each visible vertex so that a high curvature vertex projects onto an edge in the input image, and so that neighboring vertices have similar UV coordinates displacements. The former criterion is similar to the one retained in application EP13306576.3 of 18 Nov. 2013 in the name of DASSAULT SYSTEMES, and it is retained here for the same reasons. The latter criterion is a newly formulated criterion and not proves relevant in the context of 3D reconstruction but it also makes the application of MRF theory and its computational efficiency advantages available.

Figure 6:
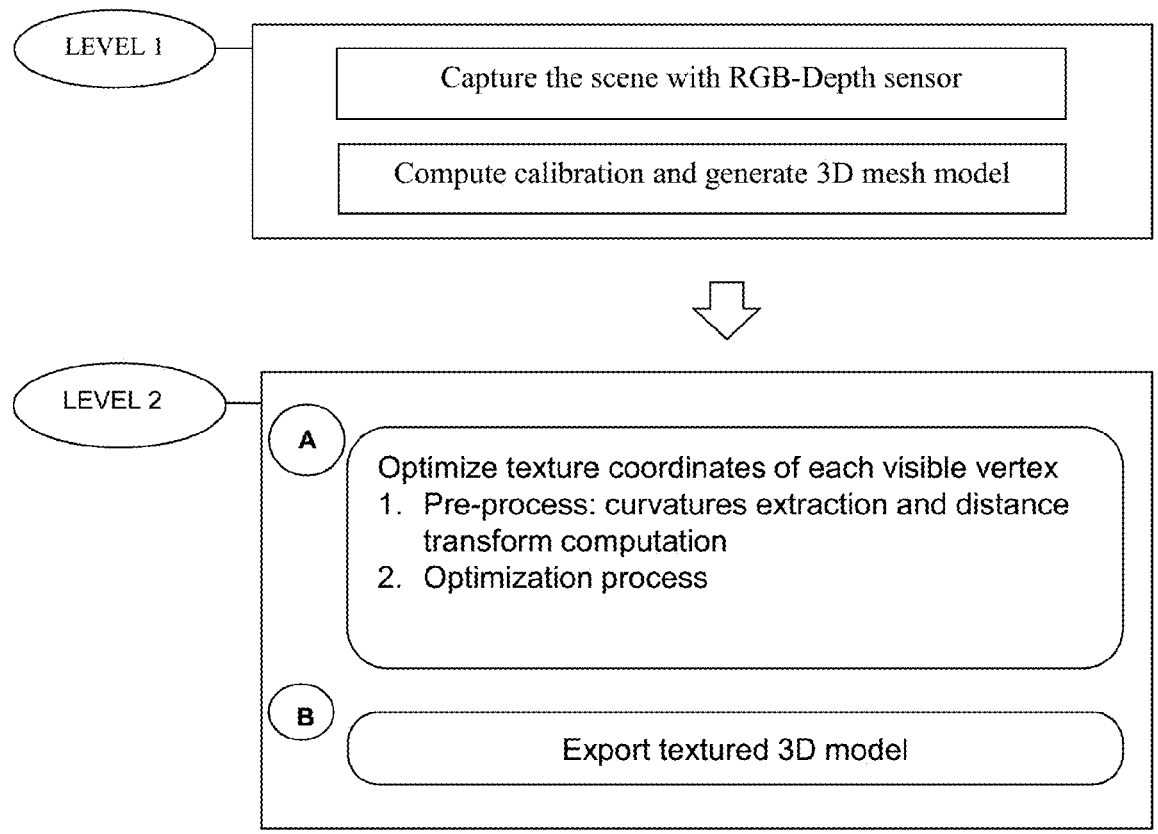
FIGS. 6-15 illustrate an example of the method.
Figure 7:
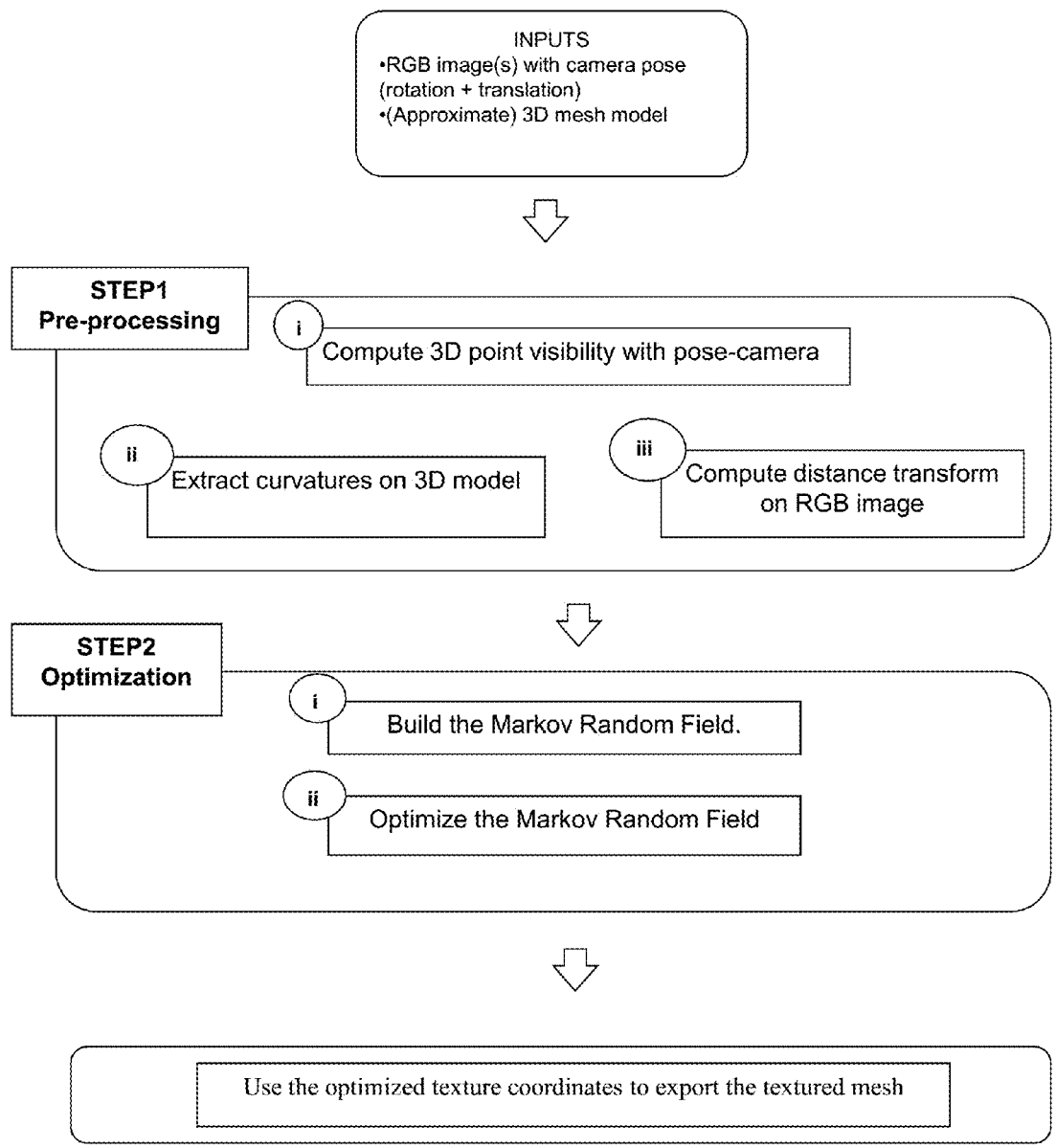

The method builds from the idea of having a camera pose for the picture intended to texture a possibly inaccurate model. FIG. 6 shows two major levels of the global texture 3D reconstruction pipeline implemented by an example of the method. The first level consists in reconstructing the 3D scene with RGB or RGB-Depth sensors: extrinsic camera parameters are then provided with a 3D mesh model. These techniques are largely described in the earlier-cited literature. The second level (i.e. the core originality of the method) is dedicated to texture coordinates optimization for the texturing process. In other words, FIG. 6 shows a global process overview in two levels, with LEVEL 1 designating 3D Reconstruction of the scene, and LEVEL 2 designating an Automatic Texturing of 3D Model. The following discussion will thus mainly focus on the description of the texture coordinates optimization process (i.e. step S20, or LEVEL 2-A of FIG. 6). The overall algorithm of the example is divided on these major steps: 1/Pre-process: robust curvatures extraction on the 3D model and distance transform computation on the image; 2/Optimization process: i) Build the graph, ii) Optimize the Markov Random Field.

Unlike state of the art approaches, the solution of the method allows high quality texturing using only an inaccurate 3D mesh model as input and a calibrated input image which may be distorted, as provided by common 3D reconstruction algorithms, and this in a fast manner. The solution of the method performs in examples particularly well if the 3D model contains a lot of edges, notably when it is based on the curvature of the 3D points. The solution of the method performs in examples particularly well with high resolution images. The solution of the method performs in examples particularly well if there are a lot of edges on the image, and if the objects on the image do not have a high color variance. The solution of the method performs in examples particularly well with contrasted images, because the solution may in examples detect strong gradients on the image. The solution of the method can in examples handle distorted meshes or images, unlike texturing processes based on camera pose optimization.

It is noted that the method builds on well-known mathematical results known from the study of Markov Random Fields. For example, the developments that have led to the method make use of the Hammersley-Clifford theorem. It is also noted that MRF theory has already been used in the field of image processing. However, previous applications see images as a grid of all image pixels, said grid defining the underlying graph of the MRF application. However, the method does not base the MRF on such a grid of pixels, but rather on a graph corresponding to the 3D mesh (i.e. the 3D mesh is seen as a graph, with a label assigned to each vertex and a conditional probability assigned to the edges). Furthermore, the MF results are here applied to 3D mesh texturing in specific. Thus, efficiency results of MRF are here smartly applied to the context of 3D reconstruction and 3D texturing.

The inputs provided at S10 are now discussed.

As known from the prior art, a real object may be represented by a CAD system in 3D with different data structures that correspond to different geometries. In the case of the method, the 3D representation (which may also be called "3D model" in the following) provided at S10 is a 3D mesh representation, well known from the prior art. Prior art 3D reconstruction techniques provide such a discrete 3D representation, as known. Examples of such techniques generally include performing measurements on a real object with sensors, and inferring the discrete 3D representation from the measurements. The technique may be a structure-from-motion analysis, meaning that multi-view images of the real object are captured to infer the discrete 3D representation via a mathematical model. The first approach (only RGB data) and the second approach (RGB and depth data) presented in the prior art constitute structure-from-motion analysis foreseen for the method. The discrete 3D mesh representation may also be obtained by laser triangulation, and/or acoustic propagation analysis, combinations of different techniques being also foreseen.

In the case of a structure-from-motion analysis consisting of 3D Reconstruction from RGB images, the method may comprise matching interest 2D points between images. Then the method may calibrate the cameras, e.g. by estimating the position relative to the observed scene (extrinsic calibration) and estimate physical parameters of the sensors (e.g. focal, distortion—intrinsic calibration). Then the method may triangulate the match point with calibration data to estimate 3D positions (e.g. point cloud generation). Then the method may build a 3D mesh model from all 3D triangulated points, thereby reaching the discrete 3D representation. Reference is made to previously cited papers Hartley and Zisserman, Szeliski, and Faugeras for details on the above steps.

In the case of a structure-from-motion analysis consisting of 3D Reconstruction from RGB-Depth, the method may mainly use depth images (i.e. image that contains disparity information for each pixel). The method may first build the 3D scene from a first depth image (i.e. 3D point cloud generation from disparity values). The method may then, for each new depth image, estimate extrinsic camera calibration (e.g.—rotation and translation—of camera from previous point of view). The method may update the global 3D point cloud. The method may finally generate a 3D mesh model from point cloud analysis, thereby reaching the discrete 3D representation. Reference is made to previously cited papers Cui et al. and Newcombe et al. for details on the above steps.

The 3D mesh and the mapping, and possibly the texturing image, may thus result from applying such a technique, within the method or prior to the method. The system may thus comprise at least one sensor coupled to the processor to provide sensing measurements, the system comprising instructions in its programs to determine the discrete 3D mesh representation according to the measurements. Preferably, the system comprises at least one depth sensor, such that the method may perform depth measurements that output a relatively accurate 3D representation of the real object. This is known from the prior art, as discussed earlier.

The texturing image is a 2D view of the real object comprising texturing information, such as an RGB image/photograph of the real object, as known from the prior art. It is noted that the 3D mesh may correspond to a visible part of the real object of which the texturing image is a photo. A view of the real object is any graphical representation of the real object, such as an image, a photo, a picture. A 2D view is thus a 2D representation allowing the viewing of the real object from only one angle/point of view, as opposed to the definition of 3D representation provided earlier. The providing of the texturing image may generally be performed independently of the providing of the 3D mesh, e.g. concomitant, prior or after. In the case of the method, the 2D view provided at S10 is calibrated. A calibrated view is one that is provided together with information ("calibration information") that allows the correspondence between positions on the 2D view and positions in a corresponding 3D representation, i.e. the 3D mesh representation provided at S10 here: this is the mapping provided at S10. For example, such information may comprise camera parameters, which are parameters that represent the configuration of a camera having captured the 2D view (possibly virtually). In other words, the camera parameters constitute information that allow an a posteriori description of a camera that could have captured the texturing image, relative to the 3D representation. The method may perform such calibrating of the texturing image, relative to the 3D mesh representation provided at S10, by computing beforehand said camera parameters, or by improving a beforehand calibration of the 2D view by computing camera parameters that are more accurate (in other words, by optimizing the previous camera parameters), such as in application EP13306576.3 of 18 Nov. 2013 in the name of DASSAULT SYSTEMES.

In the case the discrete 3D mesh representation provided at S10 is an output of a structure-from-motion analysis, the 2D view (i.e. texturing image) of the real object may be captured during this structure-from-motion analysis. In other words, structure from motion analysis may be used for the providing S10 of the 3D mesh, involving at least one 2D view, e.g. an RGB image, and said 2D view may efficiently be the texturing image provided at S10. Indeed, the structure-from-motion analysis, based on at least one 2D view as input, outputs data describing projection from the discrete 3D representation onto the input texturing image. However, although the 2D texturing image view is calibrated in this case (i.e. positions of the 2D view correspond to positions of the 3D mesh representation according to the calibration information, as they both correspond to the real positions of the real object when performing the structure from motion analysis), said calibration data is not perfectly accurate, and the method may therefore advantageously counterbalance such error via the optimization of the texture coordinates performed S20. This is particularly true in the case the 3D representation of the real object is provided by reconstructing the 3D representation from measurements of at least one depth sensor. In such a case indeed, the depth data are mainly used for determining the 3D representation, and 2D data, such as RGB images, are mainly used for other purposes (such as texturing the 3D representation). For this reason, the texturing image may be captured by a high resolution camera (providing data with at least higher resolution than the depth sensor or other cameras capturing images used to reconstruct the initial 3D representation). Thus, although the 2D view is captured by a camera synchronous to the depth sensor, there may be a shift leading to a lack of accuracy, as explained above. The method therefore leads to a more accurate final texturing.

Camera parameters that may form the mapping provided at 10 are now further discussed.

These camera parameters allow the correspondence between positions on the 2D texturing image/view and positions in the 3D mesh representation provided at S10. The camera parameters are thus associated to the texturing image, and relative to the 3D mesh provided at S10. For that, the camera parameters may include a projection matrix (e.g. describing projection from the 3D representation to the 2D view). The projection matrix may be based on a referential associated to the 3D representation and on a referential associated to the 2D view. As known, the projection matrix may include extrinsic parameters, such as 3D position of point of view, e.g. camera position, and/or orientation, e.g. rotation and translation data, and/or intrinsic parameters, such as focal length, skew parameter, principal point, and/or distortion parameters. The intrinsic parameters are parameters related to the sensor (e.g. focal, optical center projection, distortion) and are generally estimated in the prior art by an offline process as defined in the paper by Z. Zhang, "*A Flexible New Technique for Camera Calibration*", in International Conference on Computer Vision 1999. The extrinsic parameter, also called "pose parameters", are related to the position (e.g. rotation matrix and translation vector) of the image in the referential of the 3D scene (here the 3D reconstructed model). A classical way to estimate these pose parameters known from the prior art is to approximate them during a reconstruction process such as the ones mentioned above, as in RGB-Depth based reconstruction (such as described in the previously mentioned paper by Izadi et al), where RGB pose is deduced from depth camera positioning. This is made possible because both sensors (RGB and depth) are rigidly connected, that so there is only relative transformation to change referential axis.

A specific example of the method in line with the example of FIG. 6 is now discussed with reference to FIGS. 7-15. In this example, the 3D mesh, the texturing image and the mapping may all be outputted by a predetermined structure-from-motion analysis scheme applied on the real object as explained above. The mapping may thus correspond to pose camera parameters determined for the texturing image in the structure-from-motion analysis. This allows an efficient and accurate 3D reconstruction with texturing.

This example builds from the idea of having possibly an approximate 3D triangular mesh, with a calibrated (intrinsic parameters+translation/rotation of the camera at the time when the image was taken) image to use for texturing. The following discussion focuses on the description of the texture coordinates optimization process (—LEVEL 2-A of FIG. 6), detailed in FIG. 7, which shows an flowchart description of the optimization for accurate texturing implemented by the example of the method. The algorithm of the example is divided in these major steps:

1) Pre-processing: robust curvatures extraction on the 3D model, and distance transform computation on the 2D image.

2) Optimization process:
   i. Build the graph.
   ii. Optimize the Markov Random Field.

Discussion on STEP1: Pre-Processing
Discussion on Pre-Processing i

In the example, the method first computes 3D point visibility with pose-camera. The first step is indeed to extract all the visible vertices of the mesh (in case the 3D mesh includes more than vertices visible on the texturing image). This is done very easily with a low-level graphics API, such as OpenGL or DirectX. These API provide a Z-buffer algorithm, usually hardware-implemented. The Z-buffer algorithm provides a depth map of the mesh for a given camera pose. Then, the method may use this depth map to check if a vertex of the mesh is visible or not. To do so, the method may simply project all vertices of the mesh onto the depth map, and for each vertex compare its depth with the value of the depth map at the pixel location of the projected vertex. If both values are close enough, the vertex is considered visible by the method.

Discussion on Pre-Processing ii

Figure 8:
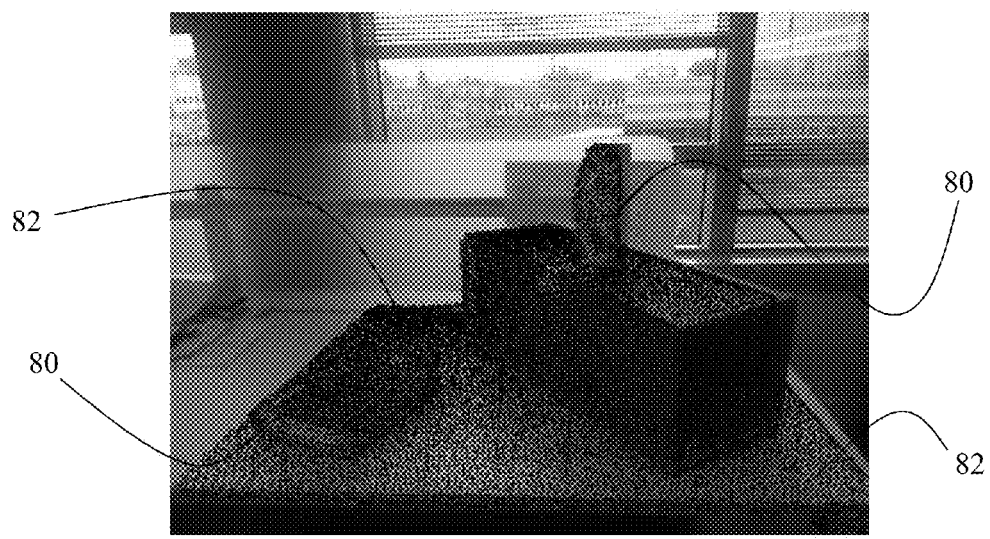

The method of the example then extracts 3D primitives on the 3D mesh. The method may use here the same method as described in application EP13306576.3 of 18 Nov. 2013 in the name of DASSAULT SYSTEMES in order to compute the highest curvature value at each visible vertex of the mesh. FIG. 8 shows a photo corresponding to a given 3D mesh (not shown) and high curvature vertices 80 of the 3D mesh (i.e. vertices having a maximum curvature higher than a predetermined threshold) and low curvature vertices 82 (i.e. vertices having a maximum curvature lower than the predetermined threshold) highlighted on the photo in different colors.

Indeed, in the example, the optimization S20 is performed with a predetermined relation between vertices of the 3D mesh and pixels of the texturing image that amounts to a predetermined relation between 3D curvature values for a vertex of the 3D mesh and distance values to a nearest contour of the texturing image for a pixel of the texturing image. The mapping provided at S10 is supposed to indicate location of a 3D vertex of the 3D mesh on the texturing image. However, as mentioned earlier, the method corrects such location with S20, based on an evaluation during the optimization S20 (via cost function $\varphi_i'$), of an extent to which a predetermined relation between values of a first function evaluated at vertices of the 3D mesh and values of a second function (corresponding to the first function) evaluated at pixels of the texturing image is respected. Any way to evaluate the "extent of respect" itself may be implemented, such as a normalized difference between said two values. The "relationship" is any form of mathematical relationship, and it may be symmetrical relationship. The aim is to evaluate if a pixel shift retained in the predetermined list of pixel shifts will lead to coherency (rules for such coherency being predefined) between features of the 3D vertex and features of the shifted texturing coordinate, and more specifically how high the incoherency would be. The method of the example implements a specific example of such "extent of respect" evaluation detailed later. Such predetermined relation forms pre-knowledge related to the texturing image and the real object represented by the 3D mesh to texture, and may thereby depend on the application.

In the case of the example, the method considers a predetermined relation between 3D curvature values for a vertex of the 3D mesh (e.g. a maximum 3D curvature value at a vertex) and values related to the 2D gradient in the texturing image (e.g. distance values to a nearest contour of the texturing image for a pixel of the texturing image, a "contour" being known a zone of the texturing image, e.g. a line, of high gradient that may be determined by any known predetermined scheme). In specific, the predetermined relation may be a decreasing function of the 3D curvature relative to said distance (that is, 3D vertices of high maximal curvature should be relatively close to contours of the texturing image). The method of the example uses a specific implementation of such a predetermined relation detailed later. This allows an optimization that takes well account of the context of having a texturing image and a real object, particularly if in the case of a structure-from-motion analysis. This is because a fold on the real object will generally result in a high curvature in the 3D representation (and thus occurrence of the geometric feature of the example) and it will generally result in a high gradient in the 2D view. Other predetermined relations may however be contemplated. For example, the pixel gradient of the texturing image may be directly considered. Other geometric features (not necessarily related to 3D curvature) and/or other graphic features (not necessarily related to pixel gradient) could be contemplated, as mentioned application EP13306576.3 of 18 Nov. 2013 in the name of DASSAULT SYSTEMES. Indeed, the method proves useful whatever the predetermined relation between the 3D vertices and the 2D pixels used (as long as such predetermined relation is a relevant one), because the method achieves an additional optimization layer with the computational advantages of discrete MRF solving.

Figure 9:
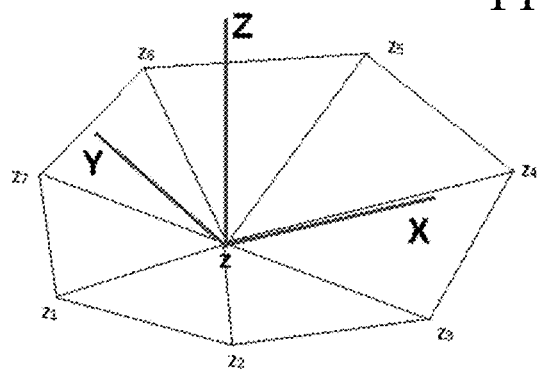

Referring to FIG. 9 which illustrates curvature estimation of a point on a triangular mesh, let x denote a 3D point on the mesh and {x1 . . . xn} its immediate neighbors, implying that for every point in {x1, xn} there exists an edge in the mesh leading to x. Let {y1 . . . yn} denote the x-translated set of neighbors, so that x becomes the origin. Let Z be the normal of the mesh at point x. If it does not yet exist, the method may average normals of neighboring triangles. The method may then assume an arbitrary direction X normal to Z and complete the orthonormal basis by Y=Z^X. We call {z, z1 . . . zn}, the projected set {x, x1 . . . xn} in the new base. The surface within the set is then estimated by a least square fitting paraboloid, from which the method deduces a curvature and direction at point z estimation. Following the orthogonal basis, one can describe the paraboloid with (a,b,c) so that: $z = ax^2 + bxy + cy^2$ The least-square method on coefficients a, b and c yields:

$$(a, b, c) = \underset{a',b',c'}{\operatorname{argmin}} \sum_{i=1}^{n} (z_i(3) - (a' z_i(1)^2 + b' z_i(1) z_i(2) + c' z_i(2)^2))^2$$

Let X be the n*3 matrix whose row i equals to $(z_i(1)^2, z_i(1)z_i(2), z_i(2)^2)$ and J the n-sized vector $(z_i(3))i$. Then the linear least-square solution is:

$$\begin{pmatrix} a \\ b \\ c \end{pmatrix} = (X^T X)^{-1} X^T J$$

As the surface of the example is regular, the principal curvatures are the Eigen values to the hessian matrix H. The mean curvature m is defined as the sum of the two principal curvatures, i.e. m=tr(H). The Gaussian curvature g being the product of the two principal curvatures, g=det(H).

Since $H = \begin{pmatrix} 2a & b \\ b & 2c \end{pmatrix}$, $m = 2(a+c)$ and $g = 4ac - b^2$.

Let c1 and c2 be the Eigen values of H at x. By definition m=c1+c2 and g=c1c2. Let $\Delta = m^2 - 4g$, and we get:

$$c1 = \frac{m + \sqrt{\Delta}}{2} \quad et \quad c2 = \frac{m - \sqrt{\Delta}}{2}$$

Obvious bounds to the surface curvature at x are [min (c1,c2); max(c1,c2)]. Therefore the curvature of highest value at x is approximated by max(|c1|,|c2|). The curvature at x may be considered to be equal to this value.

Discussion on Pre-Processing iii: Compute Distance Transform on RGB Image

The above described the pre-processing that determines 3D curvature at vertices (later in order to evaluate the extent to which the predetermined relation is respected). As mentioned above however, the specific evaluation of the example of the method also requires distance values to a nearest contour of the texturing image for a pixel of the texturing image: the "distance transform". Such distance transform can be computed as follows.

Let I be a RGB image (e.g. the texturing image), and S={x1, ..., xN} be a subset of pixels of I. The distance transform of I given S is an image whose intensity of each pixel is its distance to S, i.e. the distance to the closest pixel of S. The method may use Chamfer masks to speed-up the computation of the distance transform. Chamfer masks allow approximate but still accurate and fast distance transform computation. Chamfer masks described in the following paper may in particular be implemented: M. Stencel et al, "*On Calculation of Chamfer Distance and Lipschitz Covers in Digital Images*", in S4G 2006. Briefly, the idea is to use a small mask, which applied to a pixel gives an approximate of the distance of the neighboring pixels to it. The method may start with distance 0 for pixels of S, and infinity for the other pixels. The method may do a forward-backward pass applying a Chamfer mask, i.e. the method may start from upper left to bottom right for the forward pass, and from the bottom right to the upper left for the backward pass. For each pixel, the method may apply the Chamfer mask, and replace the distance of its neighbors if the chamfer mask returns smaller distances.

The goal in the example is to compute an image where each pixel has for value the distance to the closest edge of the input RGB image. The first step in the example is to convert the RGB image to a gray-level image. Then, the method of the example may apply a Canny edge detector to obtain the contour image, as widely known from the field of image processing, and for example as described in the paper J. F. Canny, "*A Computational Approach to Edge Detection*", in IEEE PAMI 1986, to extract the edges of the image. Briefly, the Canny edge detector smoothens the image, computes the gradient at each pixel (norm+direction), suppresses the non-maximum gradient values, and finally applies a hysteresis thresholding.

Figures 10, 11, 12:
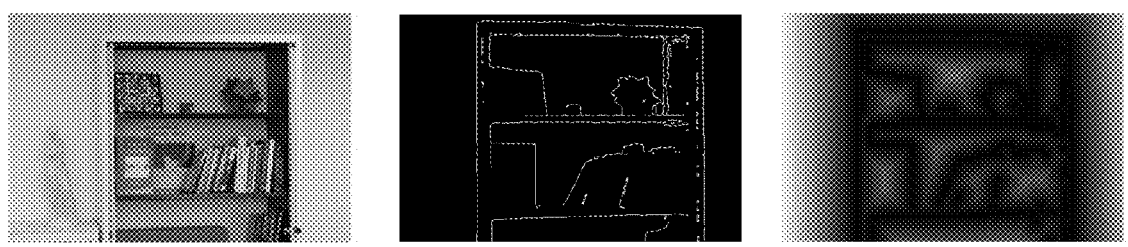

The pixels belonging to these edges form a set noted S, and the method of the example may finally apply a distance transform to the texturing image, given S. Results are shown by FIGS. 10-12 which respectively show an input image that may be provided at S10 (FIG. 10), the edges detected by the Canny edge detector (FIG. 11), and the distance transform computed by Chamfer mask (FIG. 12).

Discussion on STEP2: Optimization

Discussion on sub-step i of optimization: Build the Markov Random Field

An example of how to build the graph underlying the MRF is first presented for a triangular 3D mesh provided at S10. Generalization of the example is straightforward.

Let $V = \{v_1, \ldots, v_n\}$ be the set of the visible vertices of the 3D model, and $N(v_i) = \{v_{j_1}, \ldots, v_{j_{m(v_i)}}\}$ be the neighboring vertices of $v_i$, where $m(v_i)$ is the number of neighbors of $v_i$.

The method of the example defines the undirected graph G=(V,E), where E={{$v_i,v_j$}|i,j∈{1, ..., n}, $v_j$∈N($v_i$)}. E is the set of all the edges connecting two visible vertices in the 3D model. Let F={{$v_i, v_j, v_k$}|i, j, k∈{1, ..., n}, $v_j$∈N($v_i$), $v_k$∈N($v_i$), $v_k$∈N($v_j$)} be the set of all the visible triangles of the mesh Each node $v_i$ of the graph can take a label $L(v_i)$ from a set $L = \{l_1, \ldots, l_h\}$. In the case of the example, L is the set of the allowed shifts/displacements of the texture coordinates in pixels. The method of the example takes L={(0,0), (0,1), (1,0), (1,1), (−1,0), (0,−1), (−1,−1), (−1,1), (1,−1)} which gives 9 labels. The method could also allow two pixels displacements (25 labels) or even more, but the computation speed greatly increases as the number of labels is kept low. Instead of increasing the number of labels in the case where the distortion of the mesh is important, the method may cut/reduce the resolution of the input image and keep 1 or 2 pixels shifts as allowed labels. $L(v_i)$ is a random variable. A labeling $L(V) = (L(v_1), \ldots, L(v_n))$ is a random variable which assigns a label to every node in the graph G. Notice that the label (0,0) for a vertex is a zero displacement of its texture coordinate, and so corresponds merely to the texture coordinate computed by the texture projection mapping algorithm, i.e. projection of the vertex onto the image according to the sole mapping provided at S10.

Each node $v_i$ has a probability $P(L(v_i) = l_a)$ to take a label $l_a$. The method assumes that $v_i$ is conditionally independent of $v_j$ given $v_i$'s neighbors. This hypothesis is called the Markov property. A graph with this property is called a Markov Random Field (MRF). The edges of the graph G thus represent the dependencies between the nodes. The labels of two nodes are directly dependent if they share an edge.

The Hammersley-Clifford theorem states that if an undirected graph G satisfies the Markov property, the probability distribution P(L(V)) can be factorized over all the maximal cliques (complete subgraphs) of the graph. If the mesh is manifold, the maximal cliques of the present graph are merely the triangles of the mesh. So $$P(L(V)) = \frac{1}{Z} \prod_{\{v_i, v_j, v_k\} \in F} \psi_{i,j,k}(L(v_i), L(v_j), L(v_k)).$$

Of course, we want to involve the 3D mesh and the texturing image provided at S10, called here the observations, in the probabilistic framework. The method of the example has computed the distance transform of the input image, and the curvatures of the vertices. So we have an a priori for each label given the observations O of the distance transform and the curvatures, called a likelihood, and noted $$P(O|L(V)) = \prod_{i=1}^{n} P(O|L(V)_i) = \prod_{i=1}^{n} P(O|L(v_i)) = \frac{1}{Z'} \prod_{i=1}^{n} \varphi_i(L(v_i)).$$

Finally, we get what can be called a MAP (maximum a posteriori) inference problem. We want to find the most likely labeling L(V') knowing the curvatures and the distance transform of the input image, meaning $L(V') = \text{argmax}_{L(V)} P(L(V)|O)$.

Bayes' rule immediately gives that $L(V') = \text{argmax}_{L(V)} \Pi_{i=1}^{n} P(O|L(v_i)) \times P(L(V))$.

We can rewrite it $L(V') = \text{argmin}_{L(V)} \Sigma_{i=1}^{n} -\log(\varphi_i(L(v_i))) + \Sigma_{\{v_i,v_j,v_k\} \in F} -\log$
$(\psi_{i,j,k}(L(v_i),L(v_j),L(v_k))) + \log(Z) + \log(Z') =$
$\text{argmin}_{L(V)} \Sigma_{i=1}^{n} \varphi_i'(L(v_i)) + \Sigma_{\{v_i,v_j,v_k\} \in F} \psi_{i,j,k}'(L(v_i),$
$L(v_j),L(v_k))$, where $\varphi_i' = -\log(\varphi_i)$ and $\psi_{i,j,k}' = -\log$
$(\psi_{i,j,k})$.

Eventually we have rewritten the inference problem as a discrete optimization problem.

Notice that:

$P(L(V)|O \propto \exp(-\Sigma_{i=1}^{n} \varphi_i'(L(v_i)) - \Sigma_{\{v_i,v_j,v_k\} \in F} \psi_{i,j,k}'(L(v_i),$
$L(v_j),L(v_k)))$.

$\varphi'$ may be called the data term, because it links the label of a vertex to the observations, independently of the labels of the other nodes. $\psi'$ may be called the smoothness term, because it enforces a regularity in the labels of neighboring nodes, it links the label of a node to its neighbors.

This Markov Random Field (MRF) is a high order MRF because the cliques have a size greater than 2. This means that the smoothness term cannot be generally factorized on the edges. High order MRFs require specific optimization methods. Nevertheless, nothing prevents the method to specifically define the smoothness term such as it can be factorized on the edges of the graph, and thus get a pairwise MRF for which there exists a larger number of inference methods.

For example, the predetermined MRF solving scheme may belong to one of these four well-known classes of pairwise MRF solving algorithms:

Convex Relaxation MRF solving schemes (e.g. Linear Programming (Schlesinger 1976), Semidefinite Programming (Lasserre 2000), or Second-Order Cone Programming (Muramatsu and Suzuki, 2003)).

Dual of the Linear Programming Relaxation MRF solving schemes (e.g. Tree Reweighted Message Passing, Dual Decomposition).

Graph Cut MRF solving schemes (e.g. Alpha Expansion, Alpha-Beta Swap, FastPD).

Belief Propagation MRF solving schemes (e.g. Loopy Belief Propagation, Generalized Belief Propagation).

These are however only examples, as any pairwise MRF solving scheme in general may be implemented by the method. It is also noted that the four classes provided above are not exclusive one of another, the classification depending on the adopted point of view.

So, as indicated, the cost function $\psi_f'$ is written in the example to be of the form: $\psi_f'(\{L(v_i)\}_{i \in f}) = \Sigma_{\{i,j\} \in p(f)} \psi_{i,j}'(L(v_i),L(v_j))$, where p(f) designates the set of pairs of indices of vertices of tile f.

This allows the use of a pairwise discrete Markov Random Field optimization scheme at S20 and thus of faster performance.

In the example, as detailed hereunder, $\psi_{i,j}'(L(v_i),L(v_j))$ is specifically of the form $$\frac{\lambda}{3}(\|L(v_i) - L(v_j)\|_1,$$

where λ designates a positive scalar. λ may be superior to 0.01 and/or inferior to 0.1, e.g. approximately 0.05. Trial and error can be used to retain a best value, according to the application. Other distances may be contemplated (such as Euclidian distance).

Now, the method of the example implements a predetermined relation wherein 3D curvature values Ci lower (e.g. or equal) than a predetermined threshold C (that may, for a 3D mesh of edges of 1 millimeter order, be superior to 0.01 and/or inferior to 0.1, e.g. approximately 0.05, with a possible trial and error for adjustment) are in the predetermined relation with all distance values (noted $T_i(L(v_i))$), and 3D curvature values (e.g. strictly) higher than the predetermined threshold C are in the predetermined relation with distance values according to an increasing one-to-one correspondence. This means that, according to the very definition of such predetermined relation, when the 3D curvature is lower than the threshold any value of the distance transform is suitable, meaning that that the extent to which the relation is respected is the same for all values of the distance transform for such vertices. On the other hand, for high curvature values (above the threshold), the predetermined is a monotonous (increasing) function of the 3D curvature with respect to the distance transform value $T_i(L(v_i))$, an example of which is provided hereunder. The optimization thus focuses on the information conveyed by high curvature vertices only.

In particular, an implementation that works well is where $\varphi_i'$ is of the form $$\varphi_i'(L(v_i)) = 1_{C_i > c} \left| \frac{\gamma}{C_i} - T_i(L(v_i)) \right| \cdot 1_{C_i > c}$$

designates an indicator function, with Ci designating the 3D curvature of vertex $v_i$ and c thus designating a positive scalar, γ designating a predetermined positive scalar (that may be superior to 0.01 and/or inferior to 0.5, e.g. approximately 0.25, with a possible trial and error for adjustment), and $T_i(L(v_i))$ designating—again—the value of the relevant distance transform of the texturing image (that is, at the result of applying the pixel shift, selected during the exploration of the possible arguments for the optimization program, for vertex $v_i$, after mapping vertex $v_i$ on the texturing image), the distance transform being as mentioned earlier relative to the contour image of the texturing image precomputed beforehand.

In other words, let $T_i(x,y)$ be the distance transform of the input image, at pixel $K(v_i)+(x,y)$, where $K(v_i)$ is the projection of the vertex $v_i$ onto the input image, i.e. the initial texture coordinate of $v_i$, and $C_i$ the max curvature of the vertex $v_i$.

Then we define $$\varphi_i'(L(v_i)) = 1_{C_i > c} \left| \frac{\gamma}{C_i} - T_i(L(v_i)) \right|$$

where γ is a positive scalar which links curvatures to pixelic distances, c a positive scalar chosen to discard the low curvatures vertices in the data term.

We define $\varphi_{i,j,k}'(L(v_i),L(v_j),L(v_k)) = \lambda(\|L(v_i)-L(v_j)\|_1 + \|L(v_j)-L(v_k)\|_1 + \|L(v_i)-L(v_k)\|_1$, where λ is a positive scalar which controls the tradeoff between the smoothness term and the data term. We can notice that $\psi_{i,j,k}'(L(v_i),L(v_j),L(v_k)) = \psi_{i,j}'(L(v_i),L(v_j)) + \psi_{i,k}'(L(v_i),L(v_k)) + \psi_{j,k}'(L(v_j),L(v_k))$, where $$\psi'_{i,j}(L(v_i), L(v_j)) = \frac{\lambda}{3} \|L(v_i) - L(v_j)\|_1,$$

and thus we get a pairwise MRF, which is easier to optimize than a higher order MRF.

In the case of the example, the data term forces strong curvature vertices to have a texture coordinate close to an edge in the input texture, and the smoothness term forces neighboring vertices to get a similar displacement in their texture coordinate.

It is important to notice that the method could be implemented with other expressions for both terms. In particular, $\psi_{i,j,k}'$ could be a general higher order term.

Also, the example of cost function $\varphi_i'(L(v_i))$ is just an example, as any cost function tending to press/shift 3D vertices of high maximal curvature towards high gradient (i.e. contours) of the texturing image may be implemented.

Discussion on Sub-Step ii of Optimization: Optimize the Markov Random Field

The last step of the example is to solve the inference problem to find the best labeling, and thus the optimized texture coordinates.

There are a lot of different efficient algorithms to solve such an inference problem on a pairwise Markov Random Field, especially when the smoothness term is a metric distance. Any algorithm provided in J. Kappes et al, "*A Comparative Study of Modern Inference Techniques for Discrete Minimization Problems*", in CVPR 2013 may be implemented. In case the method would replace $\psi_{i,j,k}'$ by a general higher order term, algorithms described in H. Ishikawa, "*Higher-Order Clique Reduction in Binary Graph Cut*", in CVPR 2009 could be implemented.

Figure 13:
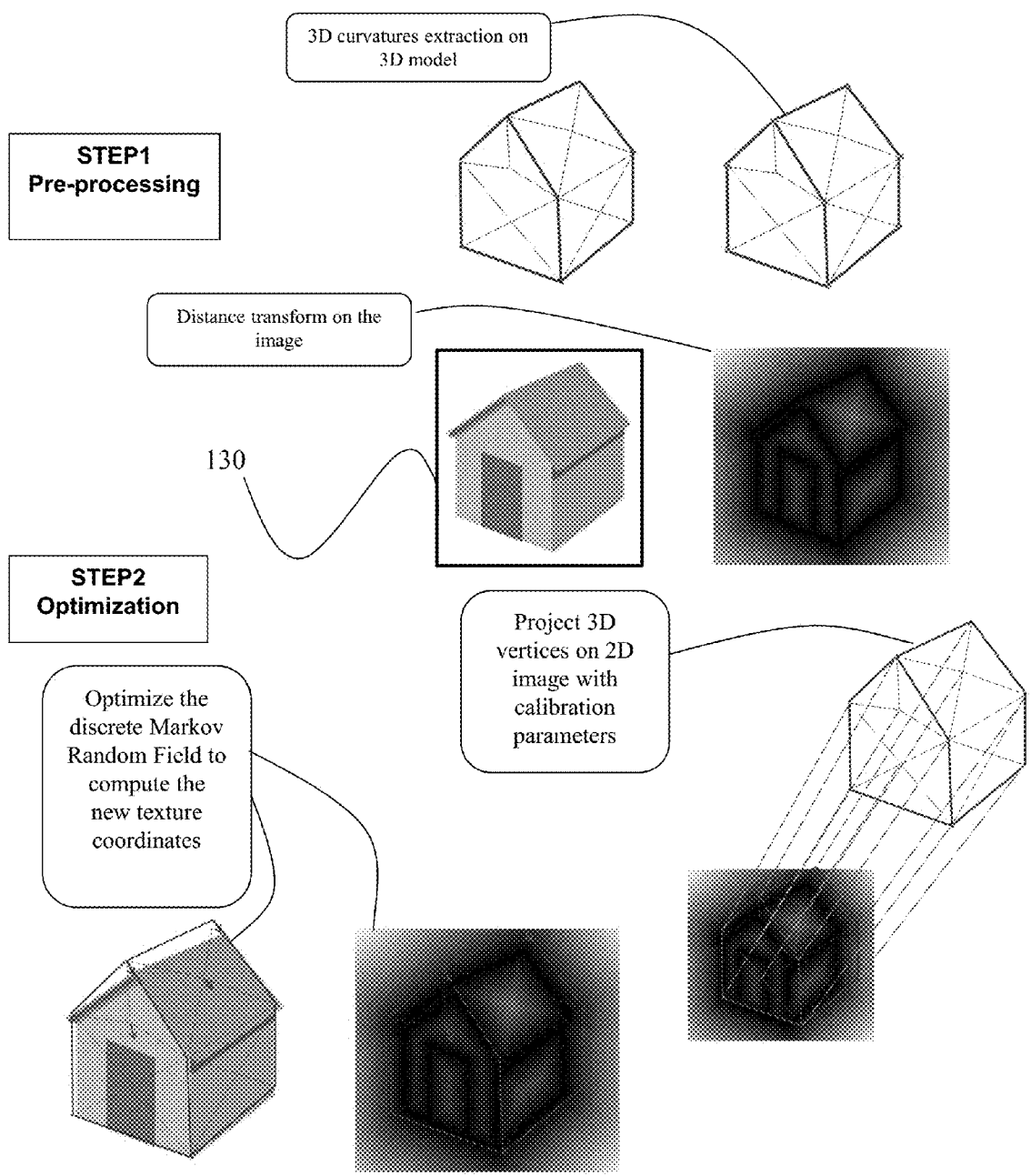
Figure 14:
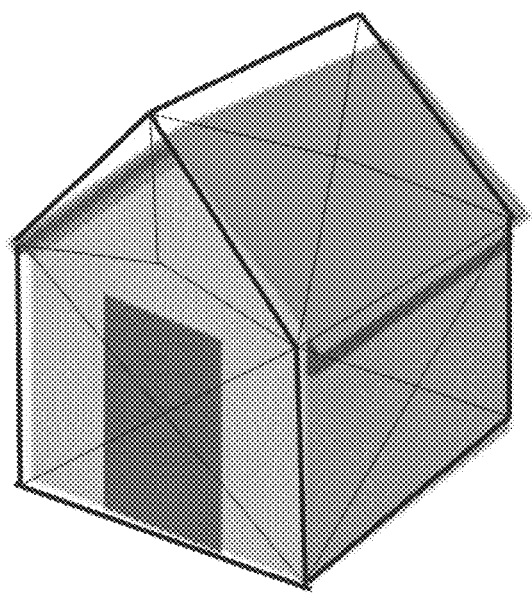
Figure 15:
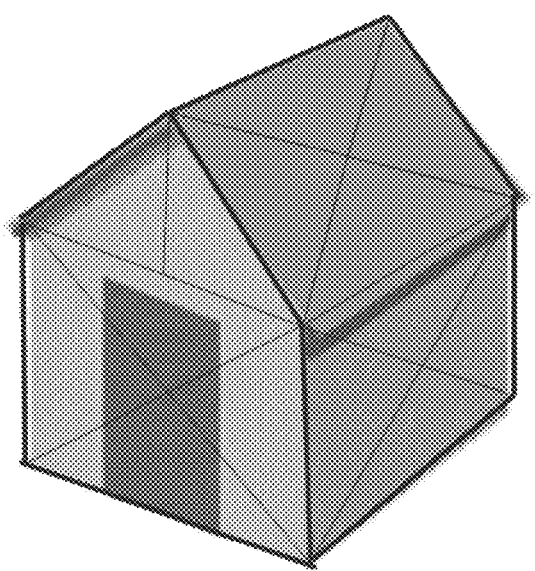

FIG. 13 illustrates schematically the overall performance of the method of the example for a house real object based on texturing image 130, thus improving accuracy of the final texturing of the house from the result of FIG. 14 to the result of FIG. 15.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for designing a 3D modeled object representing a real object, comprising:
   providing, in a Product Lifecycle Management (PLM) system, a 3D mesh representing the real object and having vertices, a texturing image and a mapping between the vertices of the 3D mesh and pixels of the texturing image, wherein the PLM system is at least one of a Computer-Aided Design (CAD) system, Computer-Aided Engineering (CAE) system, and a Computer-Aided Manufacturing (CAM) system; then
   maximizing a probability $P(L(V))$ of the form:

$$P(L(V)) = \frac{1}{Z} \exp\left(-\sum_{i=1}^{n} \varphi_i'(L(v_i)) - \sum_{f \in \mathcal{F}} \psi_f'(\{L(v_i)\}_{i \in f})\right)$$

where:
   V is a vector of vertices $v_i$,
   n designates the number of vertices of the 3D mesh and $v_i$ designates the vertices of the 3D mesh,
   $L(v_i)$ designates a pixel shift to be applied after mapping vertex $v_i$ on the texturing image and selected in a predetermined finite set (L), $$Z = \Sigma_{L(V)} \exp(-\Sigma_{i=1}^{n} \varphi_i'(L(v_i)) - \Sigma_{f \in F} \psi_f'(\{L(v_i)\}_{i \in f})),$$

F designates the set of sets of indices of mesh tiles of the 3D mesh,
   $\varphi_i'$ designates a cost function associated to vertex $v_i$ and decreasingly depending on an extent to which the result of applying the pixel shift, selected for vertex $v_i$, after mapping vertex $v_i$ on the texturing image respects a predetermined relation between vertices of the 3D mesh and pixels of the texturing image,
   $\psi_f'$ designates a cost function associated to a tile f of the 3D mesh and depending on a global difference between pixel shifts selected for the vertices of tile f,
the maximizing being performed with a predetermined discrete Markov Random Field optimization scheme viewing the 3D mesh and the pixel shifts associated to the texture coordinates of the vertices of the 3D mesh as a Markov Random Field of energy:

$$-\log(P(L(V))) - \log(Z) = \Sigma_{i=1}^{n} \varphi_i'(L(v_i)) + \Sigma_{f \in F} \psi_f'(\{L(v_i)\}_{i \in f}); \text{ and}$$

texturing the 3D mesh according to the texturing image, to the mapping, and to the result of the maximizing.

2. The method of claim 1, wherein the cost function $\psi_f'$ is of the form:

$$\psi_f'(\{L(v_i)\}_{i \in f}) = \Sigma_{\{i,j\} \in p(f)} \psi_{i,j}'(L(v_i), L(v_j)),$$

where p(f) designates the set of pairs of indices of vertices of tile f, and
   wherein the predetermined discrete Markov Random Field optimization scheme is a pairwise discrete Markov Random Field optimization scheme.

3. The method of claim 2, wherein $\psi_{i,j}'(L(v_i), L(v_j))$ is of the form $$\frac{\lambda}{3}(\|L(v_i) - L(v_j)\|_1,$$

where $\lambda$ designates a positive scalar.

4. The method of claim 1, wherein the predetermined relation between vertices of the 3D mesh and pixels of the texturing image amounts to a predetermined relation between 3D curvature values for a vertex of the 3D mesh and distance values to a nearest contour of the texturing image for a pixel of the texturing image.

5. The method of claim 4, wherein:
   3D curvature values ($C_i$) lower than a predetermined threshold (C) are in the predetermined relation with all distance values ($T_i(L(v_i))$), and 3D curvature values higher than the predetermined threshold are in the predetermined relation with distance values according to an increasing one-to-one correspondence; and
   $T_i(L(v_i))$ designates the value of a distance transform of the texturing image at the result of applying the pixel shift, selected for vertex $v_i$, after mapping vertex $v_i$ on the texturing image, the distance transform being relative to a contour image of the texturing image.

6. The method of claim 5, wherein $\varphi_i'$ is of the form:

$$\varphi_i'(L(v_i)) = 1_{C_i>c}\left|\frac{\gamma}{C_i} - T_i(L(v_i))\right|,$$

where:
  $1_{C_i>c}$ designates an indicator function, with $C_i$ designating the maximal 3D curvature of vertex $v_i$ and c designating a positive scalar, and
  $\gamma$ designates a positive scalar.

7. The method of claim 6, wherein the contour image is determined with a Canny edge detector applied on the texturing image.

8. The method of claim 6, wherein the distance transform of the texturing image is determined with a Chamfer mask applied on the texturing image relative to the contour image of the texturing image.

9. The method of claim 1, wherein the 3D mesh, the texturing image and the mapping are all outputted by a predetermined structure-from-motion analysis scheme applied on the real object, the mapping corresponding to pose camera parameters determined for the texturing image in the structure-from-motion analysis.

10. A non-transitory data storage medium comprising:
a container holding recorded thereon a computer program for designing a 3D modeled object representing a real object,
the computer program including:
providing a 3D mesh representing the real object and having vertices, a texturing image and a mapping between the vertices of the 3D mesh and pixels of the texturing image; then
maximizing a probability $P(L(V))$ of the form:

$$P(L(V)) = \frac{1}{Z}\exp\left(-\sum_{i=1}^{n}\varphi_i'(L(v_i)) - \sum_{f\in\mathcal{F}}\psi_f'(\{L(v_i)\}_{i\in f})\right)$$

where:
  V is a vector of vertices $v_i$,
  n designates the number of vertices of the 3D mesh and $v_i$ designates the vertices of the 3D mesh,
  $L(v_i)$ designates a pixel shift to be applied after mapping vertex $v_i$ on the texturing image and selected in a predetermined finite set (L),
  $Z=\Sigma_{L(V)}\exp(-\Sigma_{i=1}^{n}\varphi_i'(L(v_i))-\Sigma_{f\in F}\psi_f'(\{L(v_i)\}_{i\in f}))$,
  F designates the set of sets of indices of mesh tiles of the 3D mesh,
  $\varphi_i'$ designates a cost function associated to vertex $v_i$ and decreasingly depending on an extent to which the result of applying the pixel shift, selected for vertex $v_i$, after mapping vertex $v_i$ on the texturing image respects a predetermined relation between vertices of the 3D mesh and pixels of the texturing image,
  $\psi_f'$ designates a cost function associated to a tile f of the 3D mesh and depending on a global difference between pixel shifts selected for the vertices of tile f,
the maximizing being performed with a predetermined discrete Markov Random Field optimization scheme viewing the 3D mesh and the pixel shifts associated to the texture coordinates of the vertices of the 3D mesh as a Markov Random Field of energy:

$-\log(P(L(V)))-\log(Z)=\Sigma_{i=1}^{n}\varphi_i'(L(v_i))+\Sigma_{f\in F}\psi_f'(\{L(v_i)\}_{i\in f})$; and texturing the 3D mesh according to the texturing image, to the mapping, and to the result of the maximizing.

11. A computer system comprising:
a processor coupled to a memory,
the memory having recorded thereon a computer program comprising instructions for designing a 3D modeled object representing a real object, the instructions causing the processor to:
provide a 3D mesh representing the real object and having vertices, a texturing image and a mapping between the vertices of the 3D mesh and pixels of the texturing image; then
maximize a probability $P(L(V))$ of the form:

$$P(L(V)) = \frac{1}{Z}\exp\left(-\sum_{i=1}^{n}\varphi_i'(L(v_i)) - \sum_{f\in\mathcal{F}}\psi_f'(\{L(v_i)\}_{i\in f})\right)$$

where:
  V is a vector of vertices $v_i$,
  n designates the number of vertices of the 3D mesh and $v_i$ designates the vertices of the 3D mesh,
  $L(v_i)$ designates a pixel shift to be applied after mapping vertex $v_i$ on the texturing image and selected in a predetermined finite set (L),
  $Z=\Sigma_{L(V)}\exp(-\Sigma_{i=1}^{n}\varphi_i'(L(v_i))-\Sigma_{f\in F}\psi_f'(\{L(v_i)\}_{i\in f}))$,
  F designates the set of sets of indices of mesh tiles of the 3D mesh,
  $\varphi_i'$ designates a cost function associated to vertex $v_i$ and decreasingly depending on an extent to which the result of applying the pixel shift, selected for vertex $v_i$, after mapping vertex $v_i$ on the texturing image respects a predetermined relation between vertices of the 3D mesh and pixels of the texturing image,
  $\psi_f'$ designates a cost function associated to a tile f of the 3D mesh and depending on a global difference between pixel shifts selected for the vertices of tile f,
the maximizing being performed with a predetermined discrete Markov Random Field optimization scheme viewing the 3D mesh and the pixel shifts associated to the texture coordinates of the vertices of the 3D mesh as a Markov Random Field of energy:

$-\log(P(L(V)))-\log(Z)=\Sigma_{i=1}^{n}\varphi_i'(L(v_i))+\Sigma_{f\in F}\psi_f'(\{L(v_i)\}_{i\in f})$; and texture the 3D mesh according to the texturing image, to the mapping, and to the result of the maximizing.

* * * * *

UNITED STATES PATENT AND TRADEMARK OFFICE
CERTIFICATE OF CORRECTION

PATENT NO. : 10,013,801 B2  
APPLICATION NO. : 14/949686  
DATED : July 3, 2018  
INVENTOR(S) : Eloi Mehr Page 1 of 2

It is certified that error appears in the above-identified patent and that said Letters Patent is hereby corrected as shown below:

In the Claims

In Claim 1, Column 24, Lines 8-10, please remove:

" $Z = \Sigma_{L(V)} \exp(-\Sigma_{i=1}^{n} \varphi_i'(L(v_i)) - \Sigma_{f \in F} \psi_f'(\{L(v_i)\}_{i \in f}))$, "

And insert the following:

-- $Z = \Sigma_{L(V)} exp(-\Sigma_{i=1}^{n} \varphi_i'(L(v_i)) - \Sigma_{f \in F} \psi_f'(\{L(v_i)\}_{i \in f}))$, --

In Claim 1, Column 24, Lines 27-29, please remove:

" $-\log(P(L(V))) - \log(Z) = \Sigma_{i=1}^{n} \varphi_i'(L(v_i)) + \Sigma_{f \in F} \psi_f'(\{L(v_i)\}_{i \in f})$; and "

And insert the following:

-- $-\log(P(L(V))) - log(Z) = \Sigma_{i=1}^{n} \varphi_i'(L(v_i)) + \Sigma_{f \in F} \psi_f'(\{L(v_i)\}_{i \in f})$; and --

In Claim 2, Column 24, Lines 35-36, please remove:

" $\psi_f'(\{L(v_i)\}_{i \in f}) = \Sigma_{\{i,j\} \in p(f)} \psi_{i,j}'(L(v_i), L(v_j))$, "

And insert the following:

-- $\psi_f'(\{L(v_i)\}_{i \in f}) = \Sigma_{\{i,j\} \in p(f)} \psi_{i,j}'(L(v_i), L(v_j))$, --

Signed and Sealed this  
Fourth Day of September, 2018

Andrei Iancu  
*Director of the United States Patent and Trademark Office*

CERTIFICATE OF CORRECTION (continued)
U.S. Pat. No. 10,013,801 B2

In Claim 3, Column 24, Line 42, please remove:

" $\psi_{i,j}'(L(v_i), L(v_j))$ "

And insert the following:

-- $\psi'_{i,j}\bigl(L(v_i), L(v_j)\bigr)$ --

In Claim 10, Column 25, Line 49, please remove:

" $Z = \Sigma_{L(V)} \exp(-\Sigma_{i=1}^{n} \varphi_i'(L(v_i)) - \Sigma_{f \in F} \psi_f'(\{L(v_i)\}_{i \in f}))$, "

And insert the following:

-- $Z = \Sigma_{L(V)} \exp(-\Sigma_{i=1}^{n} \varphi'_i(L(v_i)) - \Sigma_{f \in \mathcal{F}} \psi'_f(\{L(v_i)\}_{i \in f}))$, --

In Claim 10, Column 26, Lines 5-6, please remove:

" $-\log(P(L(V))) - \log(Z) = \Sigma_{i=1}^{n} \varphi_i'(L(v_i)) + \Sigma_{f \in F} \psi_f'(\{L(v_i)\}_{i \in f}))$; and "

And insert the following:

-- $-\log(P(L(V))) - \log(Z) = \Sigma_{i=1}^{n} \varphi'_i(L(v_i)) + \Sigma_{f \in \mathcal{F}} \psi'_f(\{L(v_i)\}_{i \in f}))$; and --

In Claim 11, Column 26, Line 35, please remove:

" $Z = \Sigma_{L(V)} \exp(-\Sigma_{i=1}^{n} \varphi_i'(L(v_i)) - \Sigma_{f \in F} \psi_f'(\{L(v_i)\}_{i \in f}))$, "

And insert the following:

-- $Z = \Sigma_{L(V)} \exp(-\Sigma_{i=1}^{n} \varphi'_i(L(v_i)) - \Sigma_{f \in \mathcal{F}} \psi'_f(\{L(v_i)\}_{i \in f}))$, --

In Claim 11, Column 26, Lines 57-58, please remove:

" $-\log(P(L(V))) - \log(Z) = \Sigma_{i=1}^{n} \varphi_i'(L(v_i)) + \Sigma_{f \in F} \psi_f'(\{L(v_i)\}_{i \in f}))$; and "

And insert the following:

-- $-\log(P(L(V))) - \log(Z) = \Sigma_{i=1}^{n} \varphi'_i(L(v_i)) + \Sigma_{f \in \mathcal{F}} \psi'_f(\{L(v_i)\}_{i \in f}))$; and --